US012648193B2

(12) United States Patent
Kim et al.

(10) Patent No.: US 12,648,193 B2
(45) Date of Patent: Jun. 2, 2026

(54) POWER DEVICE AND METHOD OF MANUFACTURING THE SAME

(71) Applicant: SAMSUNG ELECTRONICS CO., LTD., Suwon-si (KR)

(72) Inventors: Joonyong Kim, Suwon-si (KR); Sunkyu Hwang, Suwon-si (KR); Boram Kim, Suwon-si (KR); Jongseob Kim, Suwon-si (KR); Junhyuk Park, Suwon-si (KR); Jaejoon Oh, Suwon-si (KR); Injun Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 522 days.

(21) Appl. No.: 18/133,276

(22) Filed: Apr. 11, 2023

(65) Prior Publication Data

US 2024/0096944 A1     Mar. 21, 2024

(30) Foreign Application Priority Data

Sep. 20, 2022    (KR) ........................ 10-2022-0118820

(51) Int. Cl.
H10D 62/10 (2025.01)
H10D 30/01 (2025.01)
(Continued)

(52) U.S. Cl.
CPC ......... H10D 62/117 (2025.01); H10D 30/015 (2025.01); H10N 39/00 (2023.02);
(Continued)

(58) Field of Classification Search
CPC .............................. H10D 62/117; H10N 39/00
(Continued)

(56) References Cited

U.S. PATENT DOCUMENTS

2006/0131737 A1*  6/2006  Im ........................ H01L 23/3128
                                                              257/E23.098
2009/0085166 A1*  4/2009  Iwamuro ........... H01L 21/02381
                                                              257/E29.089

FOREIGN PATENT DOCUMENTS

CN        209947845 U      1/2020
CN        113053842 A  *  6/2021   ......... H01L 21/4871
                    (Continued)

OTHER PUBLICATIONS

Gonzales et al., "GaN Growth on Patterned Silicon Substrates. A thermo mechanical study on wafer bow reduction", 2012 13th international Conference on Thermal, Mechanical and Multi-Physics Simulation and Experiments in Microelectronics and Microsystems, EuroSimE 2012, 2012, 6 total pages, doi:10.1109/ESimE.2012.6191708.

*Primary Examiner* — Ajay Arora
(74) *Attorney, Agent, or Firm* — Sughrue Mion, PLLC

(57) ABSTRACT

Provided are a power device and a manufacturing method thereof. A power device includes a compound semiconductor layer epitaxially grown on a substrate, a gate formed on the compound semiconductor layer, a source and a drain provided on either side of the gate, a passivation layer provided to cover the source, drain, and gate, and a cooling space region provided to form a cooling path inside the substrate. The cooling space region may be formed to a predetermined depth from the surface of the substrate and include an enlargement region having a width increasing according to a depth from the surface of the substrate. The width of an inlet of the cooling space region is less than a maximum width of the enlargement region, and the passivation layer and the compound semiconductor layer are provided to open the cooling space region.

20 Claims, 37 Drawing Sheets

(51) Int. Cl.
  *H10N 39/00* (2023.01)
  *H10P 50/24* (2026.01)
  *H10W 40/47* (2026.01)
  *H10D 30/47* (2025.01)

(52) U.S. Cl.
  CPC ........... *H10P 50/242* (2026.01); *H10W 40/47* (2026.01); *H10D 30/475* (2025.01)

(58) Field of Classification Search
  USPC ......................................................... 257/76
  See application file for complete search history.

(56) References Cited

FOREIGN PATENT DOCUMENTS

| | | |
|---|---|---|
| CN | 113380876 A | 9/2021 |
| JP | 2009-88327 A | 4/2009 |

* cited by examiner

POWER DEVICE AND METHOD OF MANUFACTURING THE SAME

CROSS-REFERENCE TO RELATED APPLICATION

This application is based on and claims priority under 35 U.S.C. § 119 to Korean Patent Application No. 10-2022-0118820, filed on Sep. 20, 2022, in the Korean Intellectual Property Office, the disclosure of which is incorporated by reference herein in its entirety.

BACKGROUND

1. Field

The disclosure relates to a power device and a method of manufacturing the same.

2. Description of the Related Art

Generally, a power conversion system includes a power device that controls the flow of current through on/off switching. In the power conversion system, the efficiency of the power device may determine the efficiency of the entire system.

A power device based on silicon (Si) may not increase the efficiency of the entire system due to limitations in the physical properties of silicon and limitations in a manufacturing process. In order to overcome these limitations, research and development have been conducted to increase the conversion efficiency by applying a compound semiconductor to a power device. In the case of a power device to which a compound semiconductor is applied, the efficiency tends to decrease as the temperature increases, and various methods have been attempted to prevent this.

SUMMARY

Provided are a power device including a cooling system and a method of manufacturing the power device including the cooling system.

Additional aspects will be set forth in part in the description which follows and, in part, will be apparent from the description, or may be learned by practice of the presented embodiments of the disclosure.

According to an aspect of the disclosure, there is provided a power device including: a substrate; a compound semiconductor layer epitaxially grown on the substrate; a gate formed on the compound semiconductor layer; a source provided on a first side of the gate and a drain provided on a second side of the gate; a passivation layer provided to on the source, drain, and gate; and a cooling space region configured to form a cooling path inside the substrate, wherein the cooling space region comprises an enlargement region having a width, which increases according to a depth from a surface of the substrate, wherein the width of an inlet of the cooling space region is less than a maximum width of the enlargement region, and wherein the passivation layer and the compound semiconductor layer are configured to form an opening for the cooling space region.

The power device may further include one or more trenches formed on the passivation layer and the compound semiconductor layer, and may be connected to the cooling space region.

The cooling space region may be connected to outside through the one or more trenches to form a cooling path.

The power device may further include a pump structure provided to form an inner space openly connected to the cooling space region on the passivation layer; and a cooling fluid filling an inner space of the pump structure and the cooling space region, wherein the cooling fluid flows according to driving of the pump structure to form a cooling path in the cooling space region and the inner space of the pump structure.

The pump structure may include: a first plate with a plurality of openings corresponding to the plurality of trenches to be openly connected to the cooling space region; a second plate spaced apart from the first plate to form an inner space of the pump structure; a sidewall connecting the first plate with the second plate; and a piezoelectric member provided on the second plate.

The passivation layer and the layer below the passivation layer may be diced at a position spaced apart from both ends of the gate to open the cooling space region.

The width of the inlet of the cooling space region may have a critical size for allowing epitaxial growth on the substrate.

The power device may further include a blocking layer formed in the inlet of the cooling space region, the blocking layer comprising a material of the substrate.

The substrate may be a Si-based substrate, and the blocking layer may include the material comprising one of Si, SiN, or SiO.

The compound semiconductor layer may include a GaN-based material, and may form a channel.

According to another aspect of the disclosure, there is provided a method of manufacturing a power device, the method including: preparing a substrate; forming a cooling path inside the substrate by forming a cooling space region including an enlargement region having a width, which increases according to a depth from a surface of the substrate and a width of an inlet of the cooling space region is less than a maximum width of the enlargement region; epitaxially growing a compound semiconductor layer on the substrate on which the cooling space region is formed; forming a gate on the compound semiconductor layer; forming a source on a first side of the gate; forming a drain on a second side of the gate; forming a passivation layer on the source, the drain, and the gate, and opening the cooling space region through the passivation layer and the compound semiconductor layer.

The forming of the cooling space region may include: forming a mask pattern having an opening at a position corresponding to an inlet of the cooling space region on the substrate; forming a trench by performing a first etching process on the substrate; forming a second passivation layer in a region including an opening of the mask pattern and an inlet of the cooling space region; and performing a second etching process on the substrate to increase the depth and width of the trench, wherein the forming of the second passivation layer and the performing of the second etching process are performed at least once to form the cooling space region.

The method may further include forming a plurality of trenches in the passivation layer and the compound semiconductor layer to form an opening for the cooling space region.

The method may further include forming a pump structure on the passivation layer to form an inner space openly connected to the cooling space region through the plurality of trenches; and filling the cooling space region and an inner space of the pump structure with a cooling fluid, and sealing the pump structure.

The method may further include dicing the passivation layer and the layer below the passivation layer at a position spaced apart from both ends of the gate to open the cooling space region.

The width of the inlet of the cooling space region may have a critical size for allowing epitaxial growth on the substrate.

The method may further include forming a blocking layer in the inlet of the cooling space region, the blocking layer including a material of the substrate.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
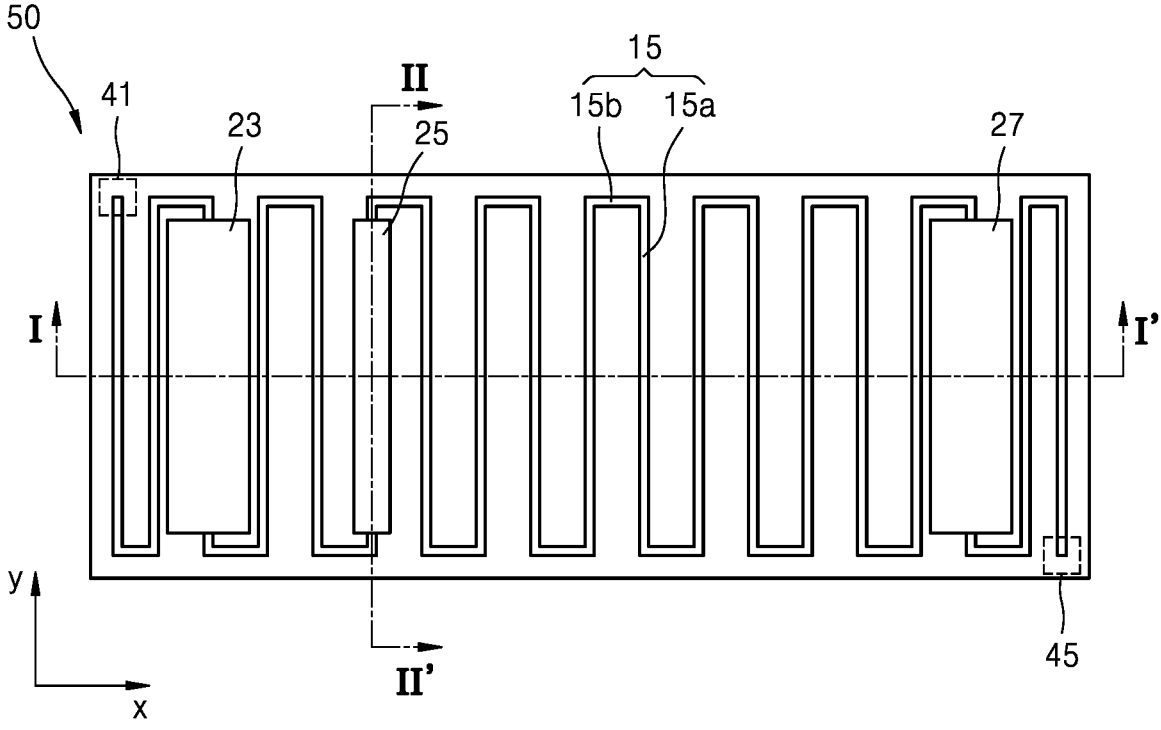
FIGS. 1 and 2 are plan views schematically illustrating a power device according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, example embodiments will be described in detail with reference to the accompanying drawings. In the following drawings, the same reference numerals refer to the same components, and the size of each component in the drawings may be exaggerated for clarity and convenience of description. Meanwhile, the embodiments described below are merely exemplary, and various modifications are possible from these embodiments.

Hereinafter, the term "upper portion" or "on" may also include "to be present above, below, or in the left or right on a non-contact basis" as well as "to be on the top portion, the bottom portion, or in the left or right in directly contact with". Singular expressions include plural expressions unless they are explicitly meant differently in context. In addition, when a part "includes" a component, this means that it may include more other components, rather than excluding other components, unless otherwise stated.

The use of the term "the" and similar indicative terms may correspond to both singular and plural. If there is no explicit description or contrary description of the steps constituting the method, these steps may be carried out in an appropriate order and are not necessarily limited to the stated order.

Further, the terms "unit", "module" or the like mean a unit that processes at least one function or operation, which may be implemented in hardware or software or implemented in a combination of hardware and software.

The connection or connection members of lines between the components shown in the drawings exemplarily represent functional connection and/or physical or circuit connections, and may be replaceable or represented as various additional functional connections, physical connections, or circuit connections in an actual apparatus.

The use of all examples or exemplary terms is simply for describing a technical idea in detail and the scope is not limited by these examples or exemplary terms unless limited by the claims.

In a power conversion system, the efficiency of a power device for switching may determine the efficiency of an entire system. In order to solve the limitation of efficiency due to a material limitation of silicon, research has been conducted to increase conversion efficiency by manufacturing a transistor using a group III-V based compound semiconductor, for example, a GaN-based semiconductor material, which is a new material. For example, in the case of a GaN power device, a cooling system application is required to prevent a decrease in efficiency due to an increase in temperature.

According to a power device and a method of manufacturing the power device according to various example embodiments described below, an empty space usable as a cooling path may be formed inside a substrate without a bonding and backside process under a lower portion of an epitaxial-grown compound semiconductor, for example, a GaN epitaxial layer or a lower thin film. The power device and the manufacturing method thereof according to an example embodiment, enable a cooling system to be constructed with only a frontside process, thereby increasing a cooling effect and reducing process costs.

Figure 2:
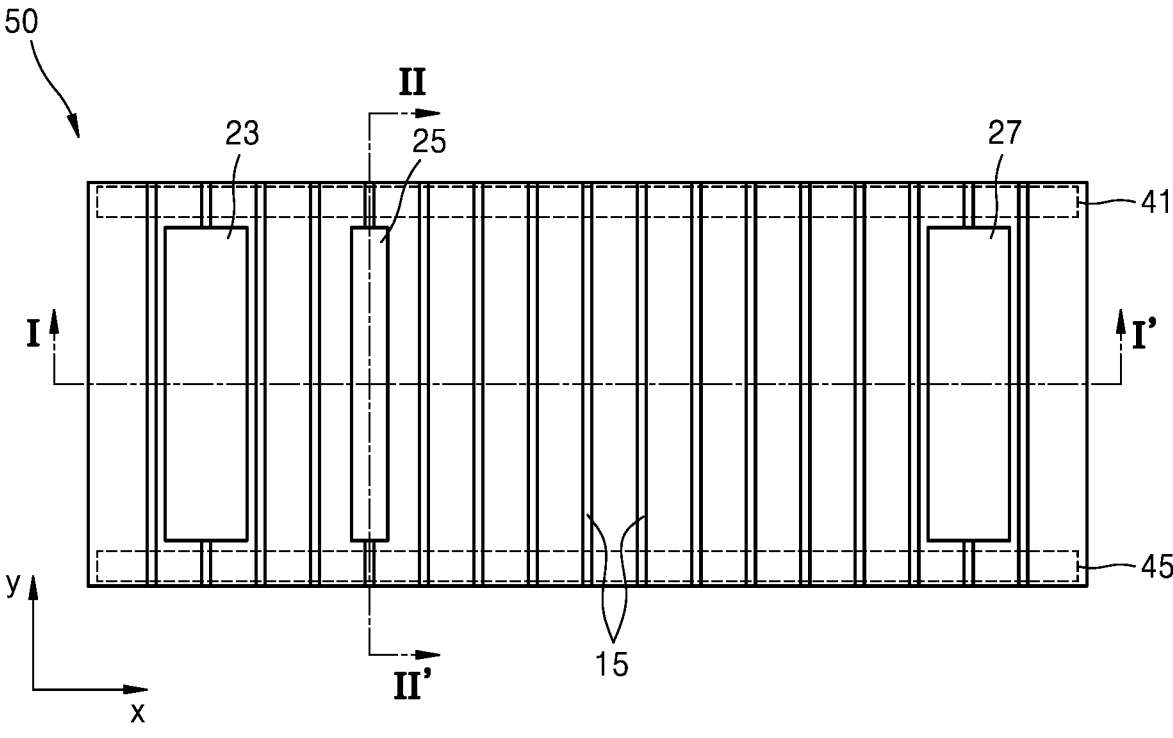
Figure 3:
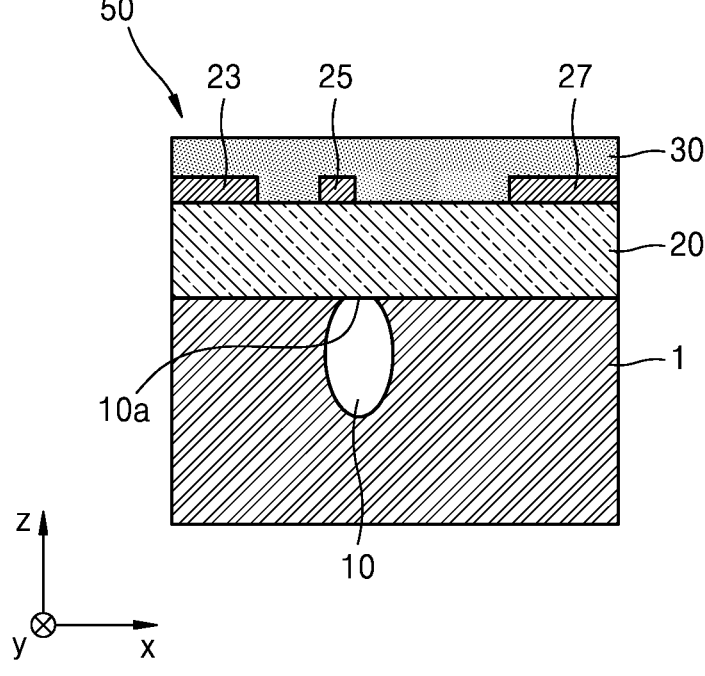
FIG. 3 is a cross-sectional view taken along line I-I' of FIGS. 1 and 2.
Figure 4:
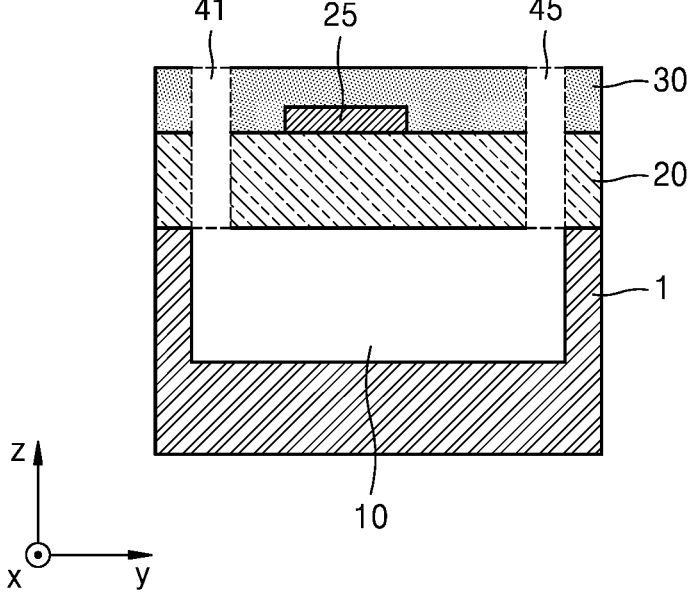
FIG. 4 is a cross-sectional view taken along line II-II' of FIGS. 1 and 2.

FIGS. 1 and 2 are plan views schematically illustrating a power device 50 according to an example embodiment, FIG. 3 is a cross-sectional view taken along line I-I' of FIGS. 1 and 2, and FIG. 4 is a cross-sectional view taken along line II-II' of FIGS. 1 and 2. FIG. 1 illustrates an example in which one cooling path 15 is formed inside a substrate 1. FIG. 2 illustrates an example in which a plurality of cooling paths 15 are formed inside a substrate 1 in a form repeated at predetermined intervals.

Referring to FIGS. 1 to 4, a power device 50 includes a substrate 1, a compound semiconductor layer 20, a gate 25, a source 23 and a drain 27, a passivation layer 30, and a cooling space region 10 provided to form a cooling path 15 inside the substrate 1. The source 23 and the drain 27 may be provided on both sides of the gate 25, respectively. The passivation layer 30 may be provided to on the source 23, the drain 27, and the gate 25. According to an example embodiment, the passivation layer 30 may be provided directly on the source 23, the drain 27, and the gate 25. According to an example embodiment, the passivation layer 30 may cover the source 23, the drain 27, and the gate 25. According to an example embodiment, the source 23, the drain 27, and the gate 25 may be embedded in the passivation layer 30. The passivation layer 30 and the compound semiconductor layer 20 may be provided to open the cooling space region 10 formed inside the substrate 1. For example, the passivation layer 30 and the compound semiconductor layer 20 may have an opening connected to the cooling space region 10 formed inside the substrate 1. Although a passivation layer 30 is not shown in FIGS. 1 and 2, the cross-sectional view in FIGS. 3 and 4 show the passivation layer 30 according to an example embodiment. Moreover, FIG. 4 illustrates the passivation layer 30 and the compound semiconductor layer 20 having openings 41 and 45, which are described below in detail.

The substrate 1 may be, for example, a substrate based on Si. For example, the substrate 1 may be a Si substrate or a SiC substrate. As another example, the substrate 1 may include sapphire or GaN. The substrate may further include various other materials.

Figure 5:
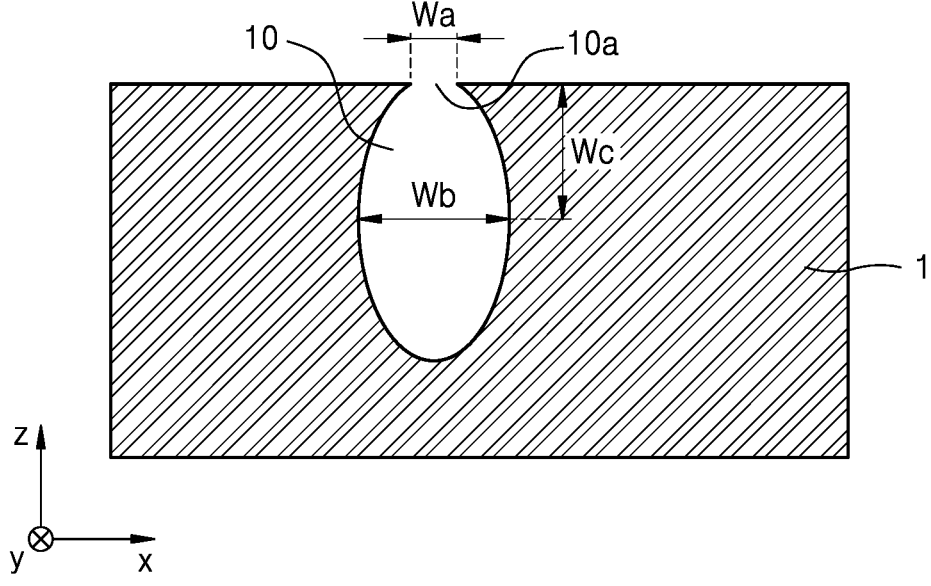
FIGS. 5 to 7 illustrate various shapes of a cooling space region of a power device according to an example embodiment.
Figure 6:
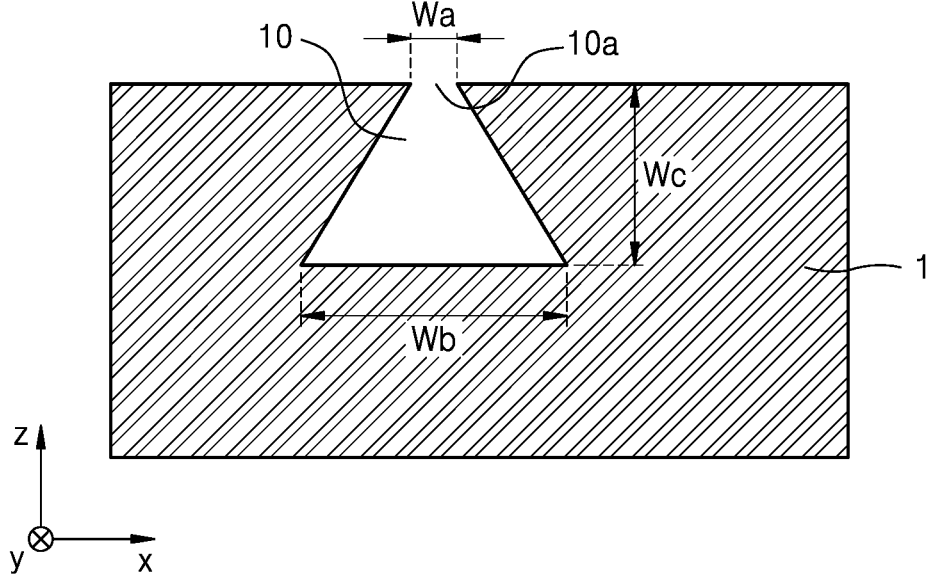
Figure 7:
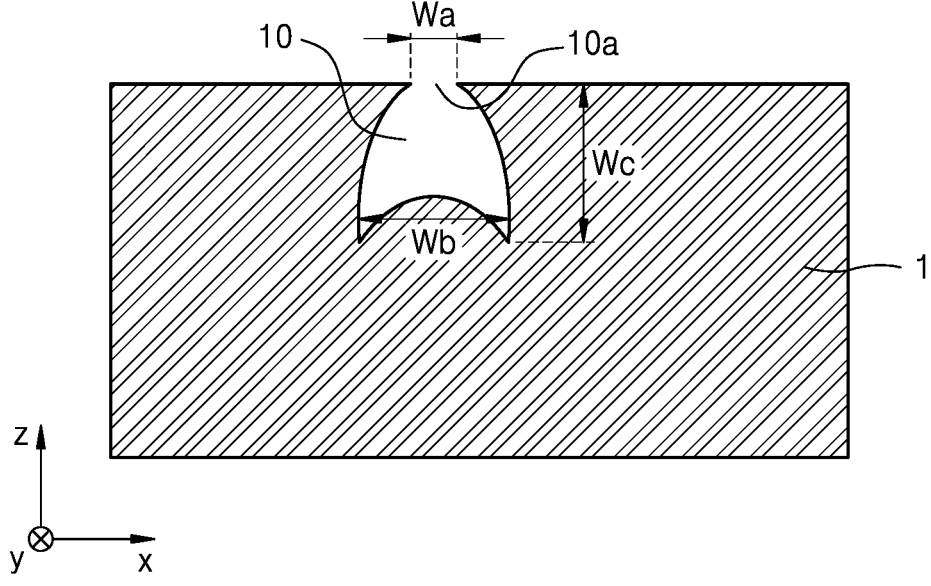

The cooling space region 10 may be formed in a trench shape from the surface of the substrate 1 to a predetermined depth so as to form a cooling path 15 inside the substrate 1. The trench forming the cooling space region 10 has an enlargement region Wc whose width increases with depth from the surface of the substrate 1 as shown in FIGS. 5 to 7. For example, as shown in FIG. 5, the enlargement region Wc may reach an intermediate depth from an inlet 10a of the cooling space region 10. In another example, the enlargement region Wc may reach the bottom depth of the trench which forms the cooling space region 10 from the inlet 10a as shown in FIGS. 6 and 7. That is, the entire region of the cooling space region 10 may be formed as an enlargement region Wc, or only a partial section may be formed as an enlargement region Wc.

FIG. 5 is an enlarged view of the cooling space region 10 of FIG. 3. FIG. 5 shows an example where the enlargement region Wc extends from the inlet 10a of the cooling space region 10 to an intermediate depth, but the embodiment is not limited thereto. As such, according to another example embodiment, the enlargement region Wc may extend to from the inlet 10a of the cooling space region 10 to a different depth. The cooling space region 10 has at least one enlargement region Wc within a range from the inlet 10a to the bottom of the trench, and the width of the cooling space region 10 may be changed in various forms.

Referring to FIG. 5, the inlet 10a in which the cooling space region 10 starts may be positioned on the surface of the substrate 1 or adjacent to the surface of the substrate 1. The cooling space region 10 may be formed such that the width Wa of the inlet 10a is less than the maximum width Wb of the enlargement region Wc. In FIG. 5, Wa denotes the width of the inlet 10a of the cooling space region 10, and Wb denotes the maximum width of the enlargement region Wc. The cooling space region 10 may be formed to satisfy a condition of Wa<Wb.

As shown in FIG. 5, the cooling space region 10 may be formed in a shape in which an enlargement region Wc is formed to a middle depth of the cooling space region 10 and a width thereof is gradually decreased at a depth less than the middle depth. That is, the cooling space region 10 may have a maximum width Wb at an intermediate depth, and may be formed in a form in which the width decreases with the depth at a position deeper than the middle. However, the disclosure is not limited thereto, and as such, according to an example embodiment, the enlargement region Wc may be formed to a depth different that the middle depth of the cooling space region 10.

According to another example embodiment, the cooling space region 10 may have a form in which the width increases with the depth from the surface of the substrate 1 to the entire depth, as shown in FIGS. 6 and 7. In this case, the cooling space region 10 may correspond to the overall enlargement region Wc, and the cooling space region 10 may be formed in a form in which the width Wa of the inlet 10a is formed in the minimum size and the maximum width Wb is formed at the bottom. As illustrated in FIG. 6, the cooling space region 10 may be formed in a shape in which a width thereof linearly increases with a depth or as illustrated in FIG. 7, the cooling space region 10 may be formed in a shape in which a width thereof is non-linearly increased with a depth. In addition, the cooling space region 10 may be formed in a flat bottom part as shown in FIG. 6, or may be formed in a shape in which the bottom part is not flat as shown in FIG. 7, for example, a convex shape. In addition, the cooling space region 10 may be formed in various forms including an enlargement region Wc in at least a partial section. The power device 50 of FIG. 3 and the power devices of various example embodiments to be described later show an example in which the cooling space region 10 is in the form of FIG. 5. The cooling space region 10 may be formed in the form shown in FIGS. 6 and 7, or may be formed in other various trench forms including the enlargement region Wc.

The cooling space region 10 may be formed, for example, by applying a deep trench process to the silicon substrate 1. In this case, instead of a deep trench in the shape of a general rod, a trench in which the width of the intermediate depth or the bottom depth is larger than the width Wa of the inlet 10a of the cooling space region 10 may be configured. For example, when the compound semiconductor layer 20 or the like is epitaxially grown, the inlet 10a of this small width Wa may lower the risk in terms of defects, and the width of the relatively large intermediate depth or bottom depth may enlarge the size of the cooling path 15.

Meanwhile, in the power device 50 according to an example embodiment, the width Wa of the inlet 10 of the cooling space region 10 may be formed to have a critical dimension (CD) capable of epitaxial growth of the compound material layer 20 or other semiconductor material layer on the substrate 1. The width Wa of the inlet 10a of the cooling space region 10 may be formed to have a critical size of, for example, about 1 μm to 5 μm or less.

The cross-sectional views of the power device 50 of FIG. 3 and the power device of various example embodiments to be described later show the single cooling space region 10 inside the substrate 1, which is only illustrated as an example. However, as can be inferred from the plan views of FIGS. 1 and 2, for one power device, a plurality of cooling space regions 10 may be repeatedly arranged inside the substrate at predetermined intervals.

Meanwhile, as can be seen from the plan view shown in FIG. 1, in the power device 50 according to an example embodiment, the cooling space region 10 formed inside the substrate 1 may be provided such that a first part 15a along the length direction (y-axis) direction) of the gate 25 and a second part 15b along the width direction (x-axis direction) of the gate 25 are repeated, and the first part 15a and the second part 15b are connected to each other to form one cooling path 15. FIG. 1 shows an example in which the first part 15a is parallel to the length direction (y-axis direction) of the gate 25 and the second part 15b is parallel to the width direction (x-axis direction) of the gate 25, but the embodiment is not limited thereto. The first part 15a of the cooling path 15 may be formed at a predetermined angle with respect to the length direction (y-axis direction) of the gate 25, and the second part 15b may be formed at a predetermined angle with the width direction (x-axis direction) of the gate 25.

Referring to FIGS. 1, 2, and 4, the power device 50 according to an example embodiment may include, for example, a plurality of trenches, for example, first and second trenches 41 and 45 formed over the passivation layer (30) and the compound semiconductor layer 20 to open the cooling space region 10. As shown in FIG. 1, when one cooling path 15 is formed inside the substrate 1, the first and second trenches 41 and 45 that open the cooling space region 10 may be formed at one end and the last end of the cooling path 15. The first and second trenches 41 and 45 may be formed to open the cooling space region 10 over the passivation layer 30 and the compound semiconductor layer 20. In FIG. 1, the dashed box indicates a first trench 41 is formed at a first end of the cooling path 15 and a second trench 41 is formed at a second end of the cooling path 15. For example, the first trench 41 may be formed at an entrance of the cooling path 15 and the second trench 41 is formed at an exit of the cooling path 15. However, the disclosure is not limited to an entrance and an exit, and the arrangement may be reversed.

As another example, as shown in the plan view illustrated in FIG. 2, in the power device 50 according to an example embodiment, the cooling space region 10 formed inside the substrate 1 may be provided to form a plurality of cooling paths 15 in a form repeated at predetermined intervals.

That is, the cooling space region 10 formed inside the substrate 1 may be provided to form a plurality of cooling paths 15, for example, in a manner that the first part 15a in FIG. 1 is repeated at predetermined intervals along the length direction (y-axis direction) of the gate 25. In FIG. 2, an example in which the cooling path 15 is parallel to the length direction (y-axis direction) of the gate 25 is illustrated, but the disclosure is not limited thereto. As such, according to another example embodiment, the cooling path 15 may be formed to have a predetermined angle with the length direction (y-axis direction) of the gate 25.

As shown in FIG. 2, when the cooling space region 10 is formed to have a plurality of cooling paths 15 separated from each other inside the substrate 1, the first and second trenches 41 and 45 that open the cooling space region 10 may be formed at one end and the last end of each cooling path 15 so as to be formed at positions spaced apart from both ends of the gate 25. The first and second trenches 41 and 45 may be formed across the passivation layer 30 and the compound semiconductor layer 20, for example, to open the cooling space region 10 of each cooling path 15. In FIG. 2, the dashed box indicates first and second trenches 41 and 45 formed at one end and the last end of the cooling path 15. Each of the first and second trenches 41 and 45 may be formed over the entire plurality of cooling paths 15, as illustrated in FIG. 2. The power device 50 according to the embodiment may be provided so that the cooling space region 10 is connected to the outside through the first and second trenches 41 and 45 to form a cooling path. According to another example embodiment described later, when the passivation layer 30 and layers below the passivation layer 30 are diced at positions spaced apart from both ends of the gate 25 to open the cooling space region 10 of each power device 50, the dashed box in FIG. 2 may correspond to a position where the power device 50 is diced for separation in units of chips. When a power device array manufactured at a wafer level is diced in units of chips, the cooling space region 10 of each power device 50 may be opened simultaneously.

Referring to FIGS. 3 and 4, the compound semiconductor layer 20 may be epitaxially grown on the substrate 1. The compound semiconductor layer 20 may include a first semiconductor material. The first semiconductor material may include a group III-V based compound semiconductor material, but is not limited thereto. The compound semiconductor layer 20 may be, for example, a GaN-based material layer, as a specific example, a GaN layer. The compound semiconductor layer 20 may form a channel. The compound semiconductor layer 20 may be, for example, an undoped GaN layer, and in some cases, may be a doped GaN layer doped with certain impurities. For example, the compound semiconductor layer 20 may be a GaN layer epitaxially grown on the substrate 1, and may form a channel.

According to an example embodiment, the compound semiconductor layer 20 may further include a buffer layer. The buffer layer may alleviate the difference in a lattice constant and a thermal expansion coefficient between the substrate 1 and the compound semiconductor layer 20 forming a channel. The buffer layer may include a nitride including at least one of Al, Ga, In, and B, and may have a single-layer or multi-layer structure. For example, the buffer layer may include at least one of materials made of AlN, GaN, AlGaN, InGaN, AlInN, or AlGaInN. According to an example embodiment, a seed layer for growing the buffer layer may be further provided between the substrate 1 and the buffer layer.

Figure 30:
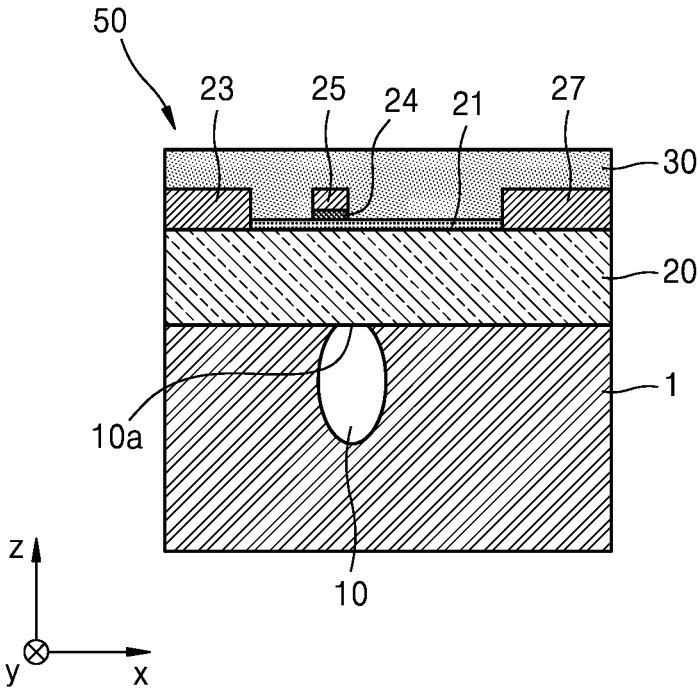
FIGS. 30 and 31 are cross-sectional views schematically illustrating a power device according to an example embodiment.
Figure 31:
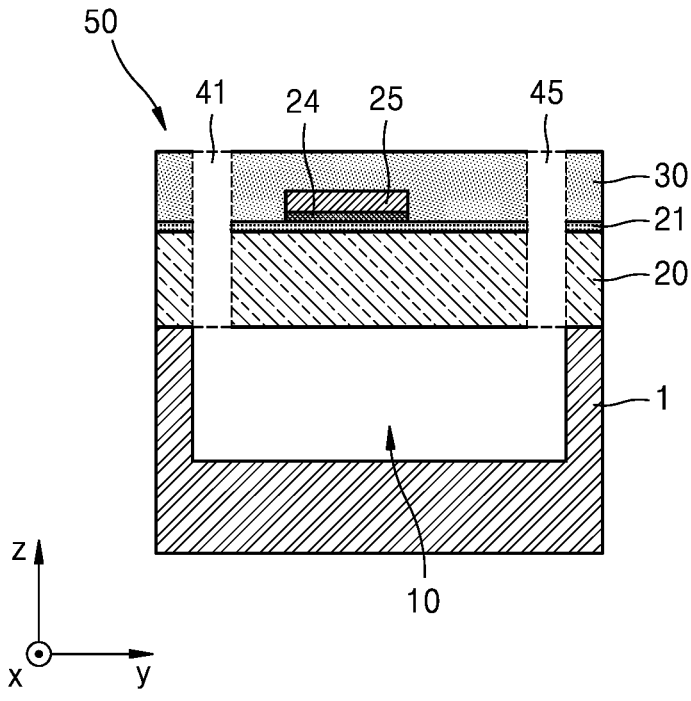

Meanwhile, referring to FIGS. 30 and 31, a barrier layer 21 may be provided on a channel of the compound semiconductor layer 20. A depletion forming layer 24 may be further provided on the barrier layer 21. FIGS. 30 and 31 show examples in which the power device 50 according to the embodiments further includes a barrier layer 21 and a depletion forming layer 24, in correspondence to FIGS. 3 and 4, respectively.

In addition to the power device 50 of this embodiment, the power device of various example embodiments to be described later may further include a barrier layer 21 and/or a depletion forming layer 24. Since an example in which the power device of various example embodiments to be described later further includes a barrier layer 21 and/or a depletion forming layer 24 may be sufficiently inferred from the examples of FIGS. 30 and 31, repeated illustrations and descriptions of an example further including the barrier layer 21 and/or the depletion forming layer 24 will be omitted.

The barrier layer 21 may generate a two-dimensional electron gas (2DEG) in the channel. Here, the two-dimensional electron gas (2DEG) may be formed in the compound semiconductor layer 20 below an interface of the compound semiconductor layer 20 forming the channel and the barrier layer 21. The barrier layer 21 may include a second semiconductor material different from the first semiconductor material forming the compound semiconductor layer 20. The second semiconductor material may differ from the first semiconductor material in at least one of polarization characteristics, an energy bandgap, and a lattice constant.

At least one of a polarization rate and an energy band gap of the second semiconductor material may be greater than that of the first semiconductor material. The barrier layer 21 may contain, for example, a nitride including at least one of Al, Ga, In, and B, and may have a single-layer or multi-layer structure. As a specific example, the barrier layer 21 may include at least one of AlGaN, AlInN, InGaN, AlN, and AlInGaN. However, embodiments are not limited thereto. The barrier layer 21 may be an undoped layer, but may be a layer doped with predetermined impurities.

The depletion forming layer 24 may include, for example, a p-type semiconductor material. That is, the depletion forming layer 24 may be a semiconductor layer doped with p-type impurities. The depletion forming layer 24 may include a group III-V based nitride semiconductor. For example, the depletion forming layer 24 may include a material in which p-type impurity is doped into at least one of GaN, AlGaN, InN, AlInN, InGaN, and AlInGaN. As a specific example, the depletion forming layer 24 may be a p-GaN layer.

Since the depletion forming layer 24 may increase the energy bandgap of the barrier layer 21 therebelow, a depletion region of two-dimensional electron gas (2DEG) may be formed in the compound semiconductor layer 20 corresponding to the depletion forming layer 24. Accordingly, a portion of the two-dimensional electron gas (2DEG) corresponding to the depletion forming layer 24 may be disconnected or may have different characteristics (e.g., electron concentration, etc.). The region where the two-dimensional electronic gas (2DEG) is disconnected may be referred to as a "disconnection region", and the power device 50 may have a normally-off characteristic by the disconnection region in which the current between the drain 27 and the source 23 is turned off when the gate voltage is 0 V.

Meanwhile, a gate 25 may be formed on the compound semiconductor layer 20, and a source 23 and a drain 27 may be formed on both sides of the gate 25. When the barrier layer 21 is provided on the channel of the compound semiconductor layer 20, the source 23 and the drain 27 may be formed on the channels of both sides of the barrier layer 21, for example. The source 23 and the drain 27 may be provided to extend parallel to each other in the y-axis direction. The source 23 and the drain 27 may include, for example, a conductive material such as Ti, Al, or the like. The source 23 and the drain 27 may be electrically connected to the 2D electronic gas (2DEG). Meanwhile, the source 23 and the drain 27 may be provided in the barrier layer 21.

The gate 25 may be provided to extend in the y-axis direction parallel to the source 23 and the drain 27. The gate 25 may include a conductive material such as a metal material or a metal compound. For example, the gate 25 may include Ti, Al, TiN, TiAl, or W, but is not limited thereto. When the barrier layer 21 is provided on the channel of the compound semiconductor layer 20, and the depletion forming layer 24 is further provided on the barrier layer 21, the gate 25 may be provided on the depletion forming layer 24 to extend along the y-axis direction in parallel with the source 23 and drain 27.

The passivation layer 30 may be formed on the compound semiconductor layer 20 to cover the source 23, the drain 27, and the gate 25. Here, the passivation layer 30 may be one dielectric layer integrally formed. The passivation layer 30 may include, for example, silicon oxide, silicon nitride, organic polymer, or the like, but is not limited thereto.

According to the power device 50 according to an example embodiment, the cooling space region 10 having the enlargement region We whose width increases with depth from the surface of the substrate 1 is formed to form have cooling path 15 inside the substrate 1, and thus it is possible to implement a cooling system integrated power device with high chip integration and increased cooling effect. According to the power device 50 according to an example embodiment, a cooling path may be formed only by a frontside process without a bonding or backside process requiring high process difficulty and high process unit cost, thereby having an advantage in terms of the process unit cost. Here, the bonding or backside process may be performed, for example, by removing silicon from the backside of the wafer or applying a material having a heat dissipation effect to the surface.

Meanwhile, in the power device 50 according to an example embodiment, the cooling space region 10 may be maintained in an empty state or may be filled with a material having good thermal conductivity.

FIGS. 8 to 12 are diagrams for describing a method of manufacturing a power device 50 according to an example embodiment.

Figure 8:
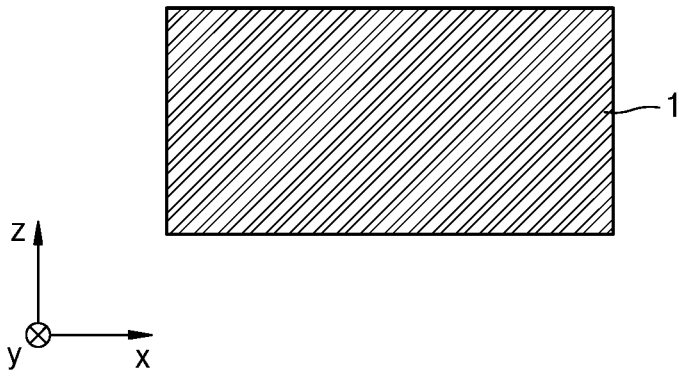
FIGS. 8 to 12 are diagrams for describing a method of manufacturing a power device according to an example embodiment.

Referring to FIG. 8, a substrate 1 is prepared. The substrate 1 may be, for example, a substrate based on Si. For example, the substrate 1 may be a Si substrate or a SiC substrate. As another example, the substrate 1 may include sapphire, GaN, or the like. In addition, the substrate 1 may include various other materials.

Figure 9:
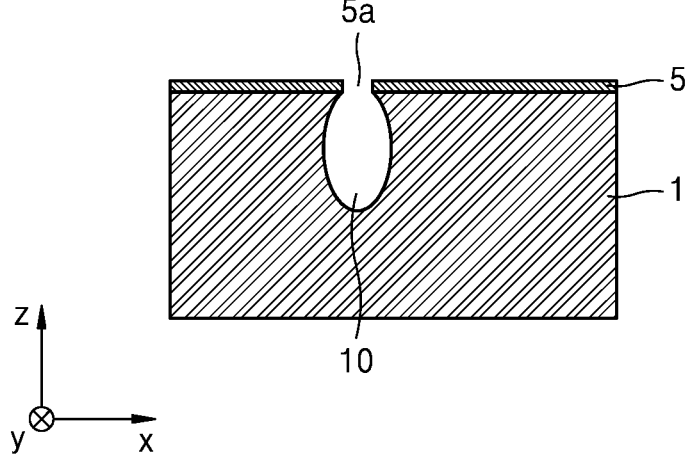

Referring to FIG. 9, a mask pattern 5 having an opening 5a at a position corresponding to the inlet 10a of the cooling space region 10 to be formed is formed on the substrate 1, and the cooling space region 10 is formed from the surface of the substrate 1 to a certain depth. The mask pattern 5 may be a hard mask pattern. The cooling space region 10 may include an enlargement region Wc whose width increases with depth from the surface of the substrate 1, and as described with reference to FIGS. 5 to 7, the width Wa of the inlet 10a may be less than the maximum width Wb of the enlargement region Wc.

The cooling space region 10 may be formed by applying a deep trench process to the substrate 1. For example, the substrate 1 may be a silicon substrate. The cooling space region 10 may be configured as a trench having a larger width of an intermediate depth or a bottom depth compared to the width of the inlet 10a. For example, when the compound semiconductor layer 20 or the like is epitaxially grown, the inlet 10a of this small width Wa may lower the risk in terms of defects, and the width of the relatively large intermediate depth or bottom depth may enlarge the size of the cooling path 15.

As described above with reference to FIG. 5, the cooling space region 10 may have a shape in which an enlargement region Wc is formed to a middle depth of the cooling space region 10 and a width thereof is gradually decreased at a depth therebelow. As another example, as described with reference to FIGS. 6 and 7, the cooling space region 10 may be formed in a form in which a width thereof linearly or nonlinearly increases according to a depth from the surface of the substrate 1 to the entire depth. In addition, as described with reference to FIGS. 6 and 7, the cooling space region 10 may have a flat bottom portion, or may be formed in a non-flat shape, for example, in a convex shape. In addition, the cooling space region 10 may be formed in various forms including an enlargement region We in at least a partial section.

Figure 29A:
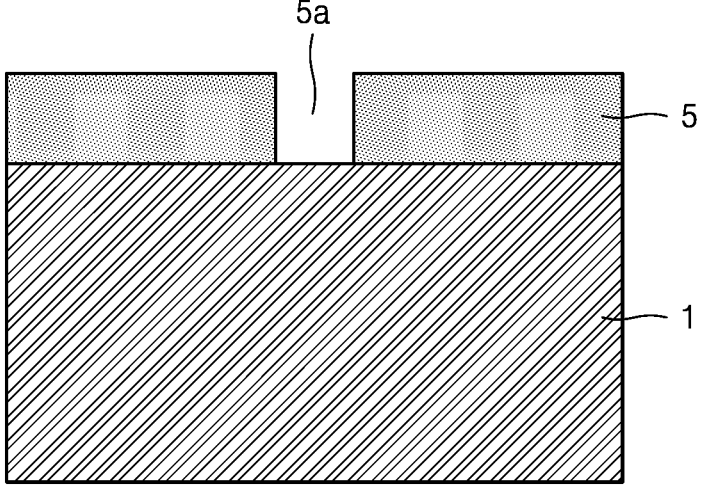
FIGS. 29A to 29C illustrate a method of forming a cooling space region forming a cooling path inside a substrate through a deep trench process.
Figure 29B:
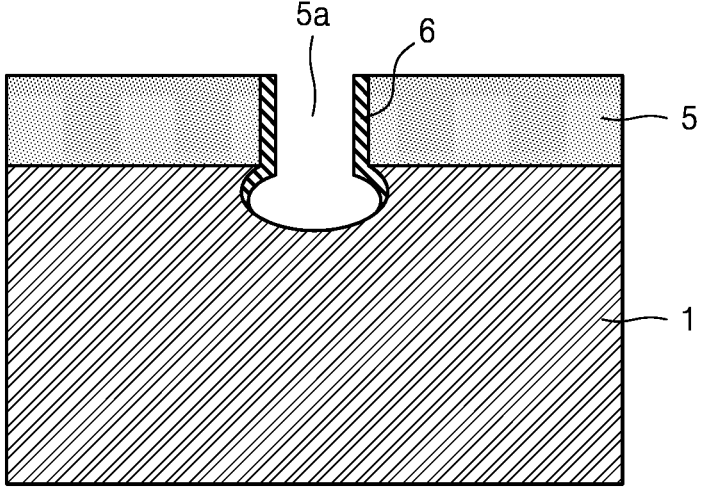
Figure 29C:
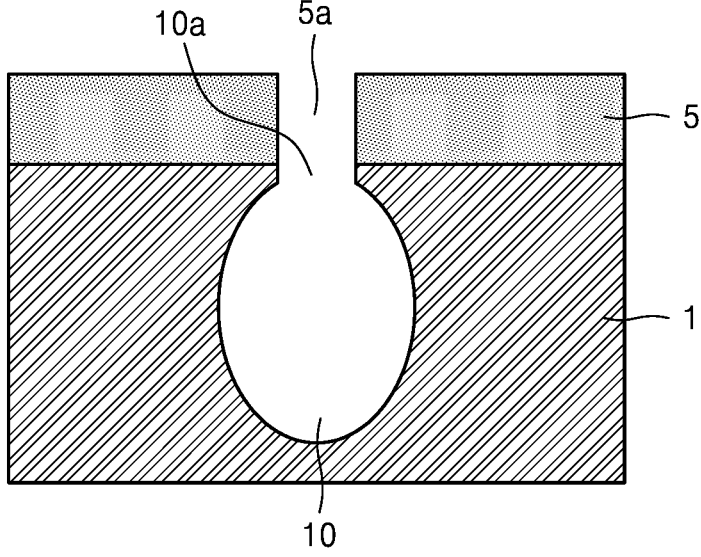

The cooling space region 10 may be formed, for example, through the manufacturing process of FIGS. 29A to 29C.

FIGS. 29A to 29C illustrate a method of forming a cooling space region 10 forming a cooling path 15 inside a substrate 1 through a deep trench process.

Referring to FIG. 29A, a mask pattern 5 having an opening 5a at a position corresponding to the inlet 10a of the cooling space region 10 is formed on the substrate 1 and then a first etching process is performed on the substrate 1 to form a trench. The mask pattern 5 may be patterned to form, for example, the cooling path 15 of FIG. 1 or 2. The first etching process may apply, for example, a high bias voltage and, for example, use an etching gas based on SF6. When a high bias voltage is applied during etching by applying an etching gas based on SF6, a reverse taper profile may be formed by ion bombardment. Accordingly, an inlet 10a of the cooling space region 10 having a small width may be formed.

Next, as shown in FIG. 29B, a passivation layer 6 may be formed in a region including an opening 5a of the mask pattern 5 and an inlet 10a of the cooling space region 10, and a second etching process may be performed on the substrate 1 to increase the depth and width of the trench. According to an example embodiment, the passivation layer 6 may be formed on the sides of the mask pattern 5 at the opening 5A. Moreover, the passivation layer 6 may be formed on a portions of the surface of the substrate 1. For the formation of the passivation layer 6, for example, a gas based on $C_4F_8$ may be used. The etched inlet 10a of the cooling space region 10 may be prevented from being widened by the passivation layer 6. In addition, when the second etching process is performed with SF6-based etching gas, an isotropic etching by ions may be strengthened rather than vertical etching in the case that the SF6 flow rate is increased under low bias voltage condition. The etching profile shape formed by this process may have a jar structure in which the inlet 10a is narrow and the inside is wide.

When the process of forming the passivation layer 6 and the process of performing the second etching process are repeated once or multiple times, as shown in FIG. 29C, a cooling space region 10 having a small inlet 10a and an enlargement region We whose width increases with depth from the surface of the substrate 1 may be formed.

Meanwhile, the width Wa of the inlet 10a of the cooling space region 10 may be formed to have a critical dimension (CD) capable of epitaxial growth of the compound semiconductor layer 20 or other semiconductor material layer on the substrate 1. The width Wa of the inlet 10a of the cooling space region 10 may be formed to have a critical size of, for example, about 1 μm to 5 μm or less. In this case, the inlet 10a of the cooling space region 10 may be blocked during epitaxial growth of the compound semiconductor layer 20 or another semiconductor material layer on the substrate 1. Here, the other semiconductor material layer may be, for example, a material based on the material of the substrate 1.

Here, like the power device 120 according to other embodiments of FIGS. 21 and 22 to be described later, when a material region 17 blocking the inlet 10a of the cooling space region 10 is separately formed, the inlet 10a of the space region 10 may have a critical size capable of epitaxial growth or may be larger than the critical size.

Meanwhile, as described above, for example, with reference to FIG. 1, the cooling space region 10 formed inside the substrate 1 through the processes of FIGS. 29A to 29C may form one cooling path 15 inside the substrate 1 in which the first part 15a in the length direction (y-axis direction) of the gate 25 and the second part 15b in the width direction (x-axis direction) of the gate 25 are repeated, and the first part 15a and the second part 15b may be connected to each other.

As another example, the cooling space region 10 formed inside the substrate 1 through the processes of FIGS. 29A to 29C may form a plurality of cooling paths 15 inside the substrate 1 in a form repeated at predetermined intervals, as described with reference to FIG. 2.

Figure 10:
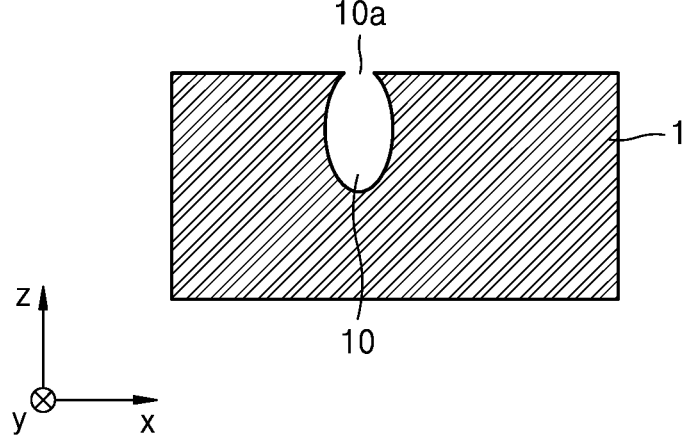

After forming the cooling space region 10 from the surface of the substrate 1 to a certain depth, removing the mask pattern 5 as shown in FIG. 10 provides a structure of having a narrow inlet 10a on the surface of the substrate 1 and forming a void-shaped cooling space region 10 to form a desired arrangement of the cooling path 15 inside the substrate 1.

Figure 11A:
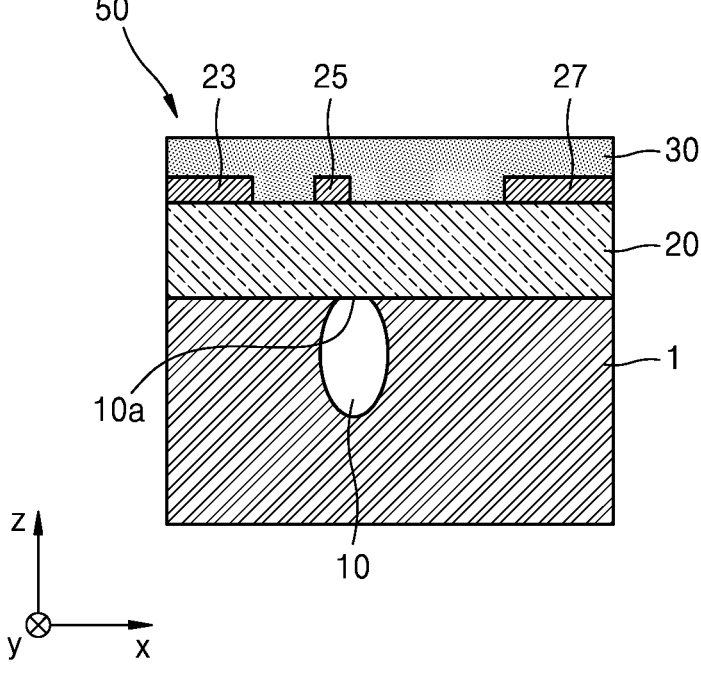
Figure 11B:
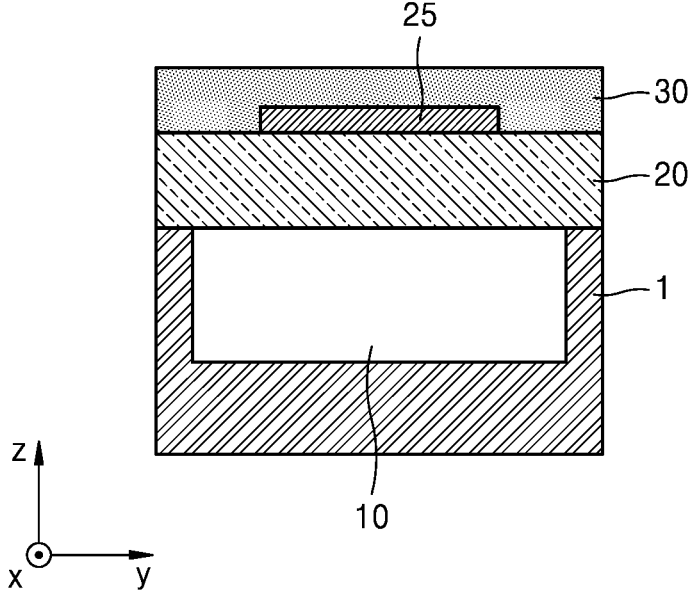

Next, referring to FIGS. 11A and 11B, a compound semiconductor layer 20 may be epitaxially grown on a substrate 1 with a cooling space region 10 formed therein, a gate 25 and a source 23 and a drain 27 provided on both sides of the gate 25 may be formed on the compound semiconductor layer 20, and then a passivation layer 30 may be formed to cover the source 23, the drain 27, and the gate 25. The passivation layer 30 may be provided to open the cooling space region 10 formed inside the substrate 1. FIG. 11A corresponds to a cross-sectional view taken along line I-I' of FIGS. 1 and 2, and FIG. 11B corresponds to a cross-sectional view taken along line II-II' of FIGS. 1 and 2.

The compound semiconductor layer 20 may be epitaxially grown on the substrate 1. The compound semiconductor layer 20 may include a first semiconductor material. The first semiconductor material may include a group III-V based compound semiconductor material, but is not limited thereto. The compound semiconductor layer 20 may be, for example, a GaN-based material layer, as a specific example, a GaN layer. The compound semiconductor layer 20 may form a channel. The compound semiconductor layer 20 may be, for example, an undoped GaN layer, and in some cases, may be a doped GaN layer doped with certain impurities. For example, the compound semiconductor layer 20 may be a GaN layer epitaxially grown on the substrate 1, and may form a channel.

According to an example embodiment, the compound semiconductor layer 20 may further include a buffer layer. The buffer layer may alleviate the difference in a lattice constant and a thermal expansion coefficient between the substrate 1 and the compound semiconductor layer 20 forming a channel. The buffer layer may include a nitride including at least one of Al, Ga, In, and B, and may have a single-layer or multi-layer structure. For example, the buffer layer may include at least one of materials made of AlN, GaN, AlGaN, InGaN, AlInN, or AlGaInN. According to an example embodiment, a seed layer for growing the buffer layer may be further provided between the substrate 1 and the buffer layer.

As described with reference to FIGS. 30 and 31, a barrier layer 21 may be further provided on the channel of the compound semiconductor layer 20, and a depletion forming layer 24 may be further provided on the barrier layer 21.

The barrier layer 21 may generate a two-dimensional electron gas (2DEG) in the channel. Here, the 2DEG may be formed in the compound semiconductor layer 20 below the interface of the channel and the barrier layer 21. The barrier layer 21 may include a second semiconductor material different from the first semiconductor material forming the compound semiconductor layer 20. The second semiconductor material may differ from the first semiconductor material in at least one of polarization characteristics, an energy bandgap, and a lattice constant.

At least one of a polarization rate and an energy band gap of second semiconductor material may be greater than that of the first semiconductor material. The barrier layer 21 may contain, for example, a nitride including at least one of Al, Ga, In, and B, and may have a single-layer or multi-layer structure. As a specific example, the barrier layer 21 may include at least one of AlGaN, AlInN, InGaN, AlN, and AlInGaN. However, embodiments are not limited thereto. The barrier layer 21 may be an undoped layer, but may be a layer doped with predetermined impurities.

The depletion forming layer 24 may include, for example, a p-type semiconductor material. That is, the depletion forming layer 24 may be a semiconductor layer doped with p-type impurities. The depletion forming layer 24 may include a group III-V based nitride semiconductor. For example, the depletion forming layer 24 may include a material in which p-type impurity is doped into at least one of GaN, AlGaN, InN, AlInN, InGaN, and AlInGaN. As a specific example, the depletion forming layer 24 may be a p-GaN layer.

Since the depletion forming layer 24 may increase the energy bandgap of the barrier layer 21 therebelow, a depletion region of two-dimensional electron gas (2DEG) may be formed in the compound semiconductor layer 20 corresponding to the depletion forming layer 24. Accordingly, a portion of the two-dimensional electron gas (2DEG) corresponding to the depletion forming layer 24 may be disconnected or may have different characteristics (e.g., electron concentration, etc.). The region where the two-dimensional electronic gas (2DEG) is disconnected may be referred to as a "disconnection region", and the power device 50 may have a normally-off characteristic by the disconnection region in which the current between the drain 27 and the source 23 is turned off when the voltage of the gate 25 is 0 V.

Meanwhile, a gate 25 may be formed on the compound semiconductor layer 20, and a source 23 and a drain 27 may be formed on both sides of the gate 25. When the barrier layer 21 is provided on the channel of the compound semiconductor layer 20, the source 23 and the drain 27 may be formed on the channel of both sides of the barrier layer 21, for example. The source 23 and the drain 27 may be provided to extend parallel to each other in the y-axis direction. The source 23 and the drain 27 may include, for example, a conductive material such as Ti, Al, or the like. The source 23 and the drain 27 may be electrically connected to the 2DEG. Meanwhile, the source 23 and the drain 27 may be provided in the barrier layer 21.

The gate 25 may be provided to extend in the y-axis direction parallel to the source 23 and the drain 27. The gate 25 may include a conductive material such as a metal material or a metal compound. For example, the gate 25 may include Ti, Al, TiN, TiAl, or W, but is not limited thereto. When the barrier layer 21 is provided on the channel of the compound semiconductor layer 20, and the depletion forming layer 24 is further provided on the barrier layer 21, the gate 25 may be provided on the depletion forming layer 24 to extend along the y-axis direction in parallel with the source 23 and drain 27.

The passivation layer 30 may be formed on the compound semiconductor layer 20 to cover the source 23, the drain 27, and the gate 25. Here, the passivation layer 30 may be one dielectric layer integrally formed. The passivation layer 30 may include, for example, silicon oxide, silicon nitride, organic polymer, or the like, but is not limited thereto.

Figure 12:
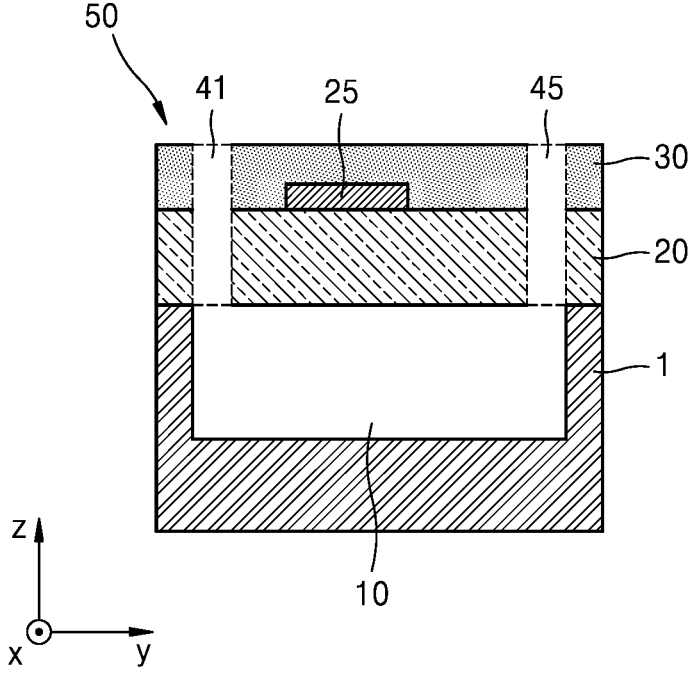

Next, referring to FIG. 12, a plurality of trenches, for example, first and second trenches 41 and 45 formed over the passivation layer 30 and the compound semiconductor layer 20 may be formed to open the cooling space region 10. In this case, as shown in FIG. 1, when one cooling path 15 is formed inside the substrate 1, the first and second trenches 41 and 45 that open the cooling space region 10 may be formed at a first end and a second end of the cooling path 15. In addition, as shown in FIG. 2, when the cooling space region 10 is formed to have a plurality of cooling paths 15 separated from each other inside the substrate 1, the first and second trenches 41 and 45 that open the cooling space region 10 may be formed at one end and the last end of each cooling path 15 so as to be formed at positions spaced apart from both ends of the gate 25. The first and second trenches 41 and 45 may be formed across the passivation layer 30 and the compound semiconductor layer 20, for example, to open the cooling space region 10 of each cooling path 15. Accordingly, the power device 50 according to the embodiment may be obtained.

Figure 13:
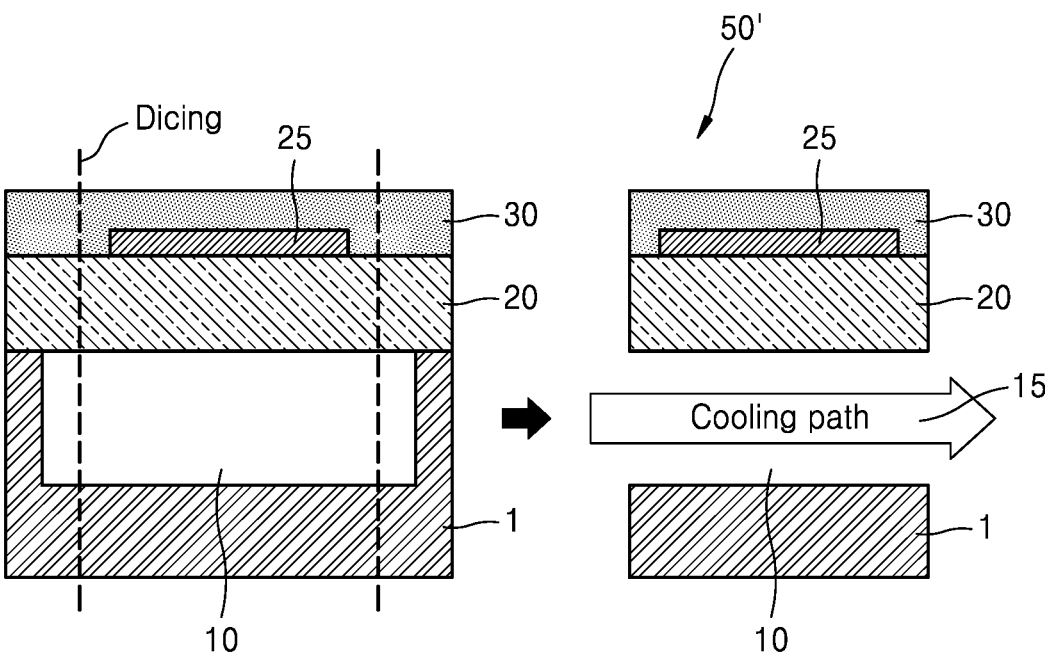
FIG. 13 is a diagram for describing a method of manufacturing a power device according to another example embodiment.

FIG. 13 is a diagram for describing a method of manufacturing a power device 50' according to another example embodiment. In order to manufacture the power device 50' according to another example embodiment, a process of manufacturing the power device 50 according to the embodiment described with reference to FIGS. 8 to 11B may be applied, except that the passivation layer 30 and the layers below the passivation layer 30 are diced at positions spaced apart from both ends of the gate 25, to open the cooling space region 10.

In FIG. 13, the left-hand view corresponds to FIG. 11B and shows the state before the cooling space region 10 is opened. In FIG. 13, the right-hand view shows a state after the cooling space region 10 is opened by dicing, and a cooling path 15 may be formed inside the substrate 1 by the opened cooling space region 10.

In the power device 50' according to another example embodiment, a portion in which dicing is performed may correspond to, for example, a dashed box position in FIG. 2. As illustrated in FIG. 13, when the cooling space region 10 is opened by dicing, the cooling space region 10 may be formed to have a plurality of cooling paths 15 separated from each other inside the substrate 1 as illustrated in FIG. 2.

As another example, even when the cooling space region 10 is formed to have the one cooling path 15 inside the substrate 1, as illustrated in FIG. 1, the passivation layer 30 and layers below the passivation layer 30 may be diced at positions separated from both ends of the gate 25 to open the cooling space region 10. In this case, only the first end and the second end of the cooling path 15 may be diced to be opened, and the first end and the second end of the cooling path 15 may be formed to protrude from the second part 15b to enable such an open structure. According to another example embodiment, the passivation layer 30 and the layers below the passivation layer 30 may be diced to remove the second part 15b of the cooling path 15 in FIG. 1. In this case, a plurality of cooling paths 15 separated from each other may be formed inside the substrate 1.

FIGS. 14 to 18 are diagrams for describing a method of manufacturing a power device 100 according to another example embodiment. The power device 100 according to another example embodiment is the same as or similar to the structure and manufacturing process of the power device 50 according to the embodiments described with reference to FIGS. 8 to 13, except that the material layer 11, for example, an Si epitaxial layer is further included on the substrate 1, and thus redundant description thereof will be omitted. The substrate 1 in which the cooling space region 10 is formed to a predetermined depth shown in FIG. 14 may be formed by applying the above-described manufacturing processes with reference to FIGS. 8 to 10 and 29A to 29C. In this case, the cooling path 15 as described with reference to FIGS. 1 and 2 may be formed inside the substrate 1.

Figure 14:
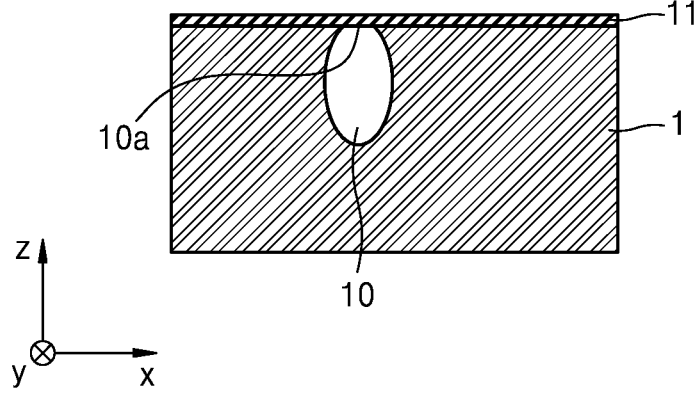
FIGS. 14 to 18 are diagrams for describing a method of manufacturing a power device according to another example embodiment.

Referring to FIG. 14, a material layer 11 based on the material of the substrate 1 may be epitaxially grown on the substrate 1 in which the cooling space region 10 is formed to a predetermined depth. For example, when the substrate 1 is a Si substrate, the material layer 11 may be a Si epitaxial layer. The material layer 11 may be epitaxially grown on the substrate 1 to block the inlet 10a of the cooling space region 10. As another example, the inlet 10a of the cooling space region 10 may be blocked with a material such as Si, SiN, SiO, etc., and then the material layer 11 may be epitaxially grown on the substrate 1. FIGS. 14 to 18 show example cases where the material layer 11 is epitaxially grown on the substrate 1 to block the inlet 10a of the cooling space region 10.

Figure 15A:
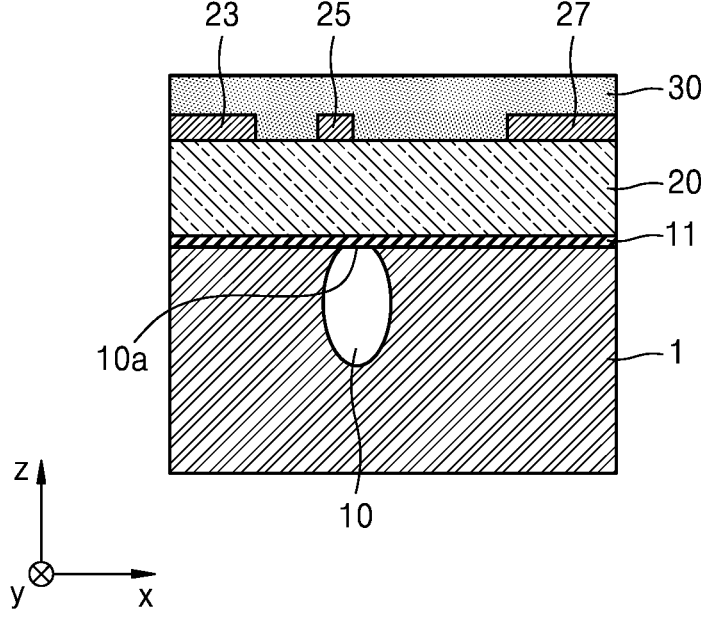
Figure 15B:
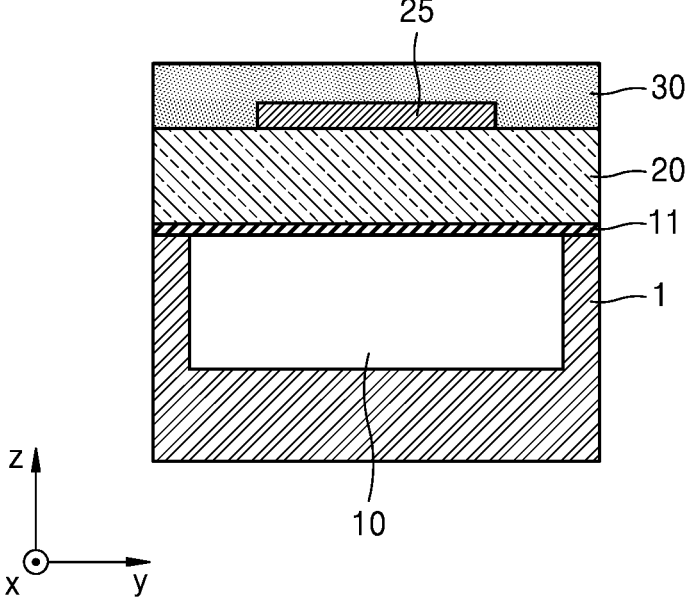

Next, as shown in FIGS. 15A and 15B, the compound semiconductor layer 20 may be epitaxially grown on the material layer 11, a gate 25, a source 23, and a drain 27 may be formed on the compound semiconductor layer 20, and a passivation layer 30 may be formed to cover the gate 25, the source 23, and the drain 27.

Figure 16:
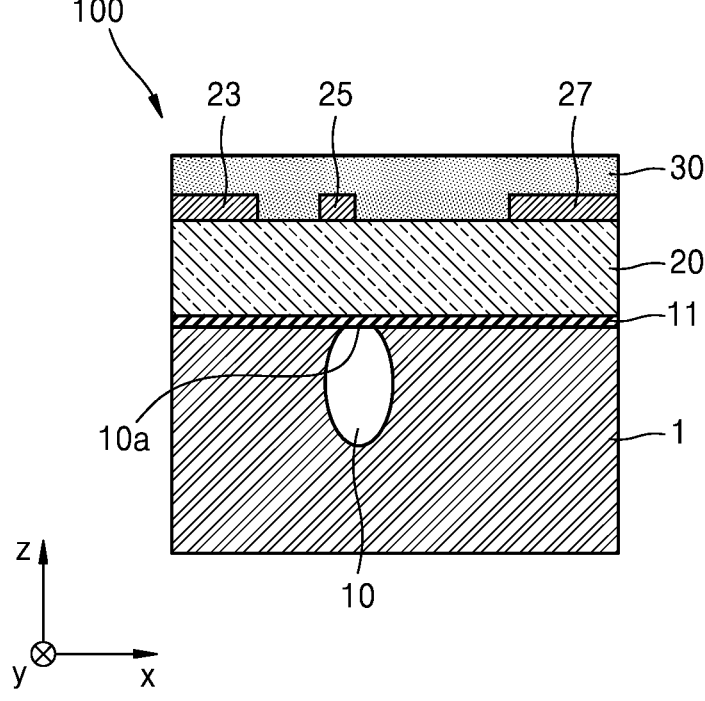
Figure 17:
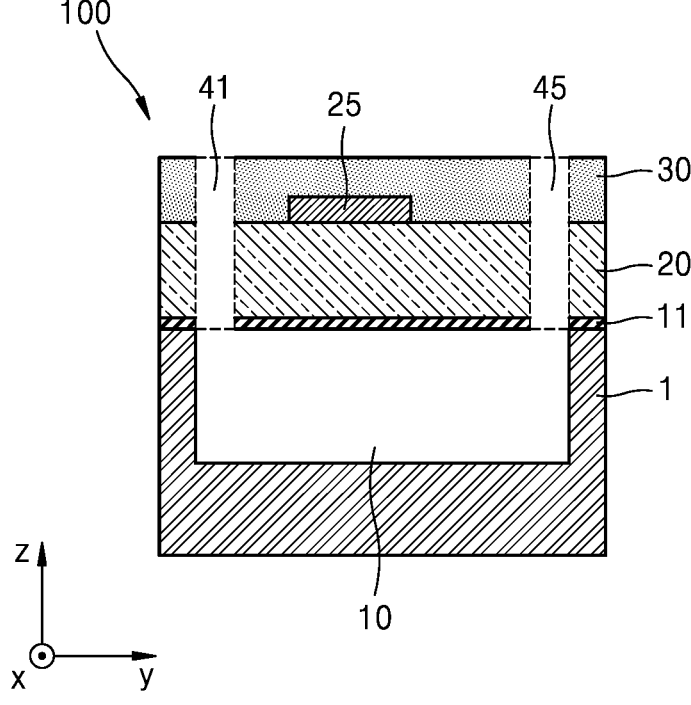

Then, a plurality of trenches, e.g., first and second trenches 41 and 45 may be formed across the passivation layer 30, the compound semiconductor layer 20, and the material layer 11, as shown in FIGS. 16 and 17, whereby the cooling space region 10 may be opened. Alternatively, the passivation layer 30 and lower layers thereof may be diced at positions spaced apart from both ends of the gate 25 as shown in FIG. 18, whereby the cooling space region 10 may be opened.

FIGS. 16 and 17 are cross-sectional views schematically illustrating a power device 100 according to an example embodiment. An example of forming a plurality of trenches, for example, first and second trenches 41 and 45 across the passivation layer 30, the compound semiconductor layer 20, and the material layer 11 is shown. The power device 100 of FIGS. 16 and 17 is the same as the configuration of the power device 50 according to the embodiments described with reference to FIGS. 3 and 4, except that the material layer 11, for example, a Si epitaxial layer is further included. FIG. 16 corresponds to a cross-sectional view taken along line I-I' of FIGS. 1 and 2, and FIG. 17 corresponds to a cross-sectional view taken along line II-II' of FIGS. 1 and 2.

Figure 18:
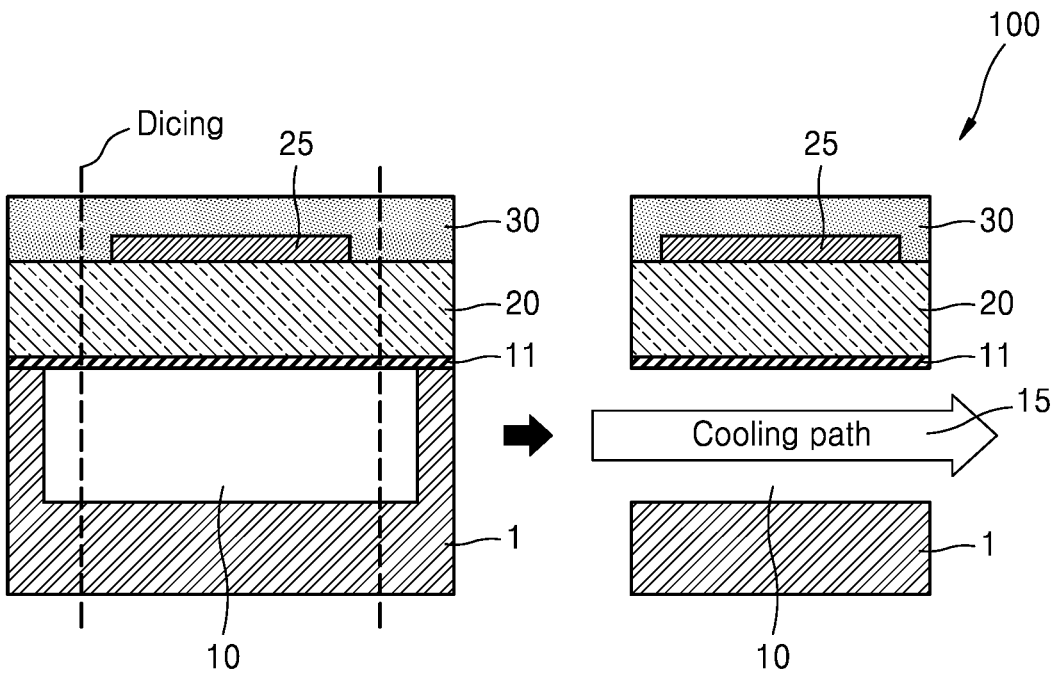

FIG. 18 is a view showing an example in which the power device 100 according to another example embodiment is formed to open the cooling space region 10 by dicing, and as in FIG. 13, the left-hand view shows the state before opening the cooling space region 10 by dicing, and the right-hand view shows the state after opening the cooling space region 10 by dicing.

Referring to FIG. 18, in order to manufacture the power device 100 according to another example embodiment, the cooling space region 10 may be opened by dicing the passivation layer 30 and the lower layers thereof at positions spaced apart from both ends of the gate 25.

In this case, in the power device 100 according to another example embodiment, the cooling space region 10 may be formed to have multiple cooling paths 15 separated from each other inside the substrate 1, and a part in which the dicing is performed may correspond to a dashed box position in FIG. 2, for example. As another example, even when the cooling space region 10 is formed to have one cooling path 15 inside the substrate 1, as illustrated in FIG. 1, the passivation layer 30 and lower layers thereof may be diced at positions separated from both ends of the gate 25 to open the cooling space region 10. In this case, only one end and the last end of the cooling path 15 may be diced to be opened, and the one end and the last end of the cooling path 15 may be formed to protrude from the second part 15b to enable such an open structure. In addition, the passivation layer 30 and lower layers thereof may be diced to remove the second part 15b of the cooling path 15 in FIG. 1. In this case, the power device 100 may have a plurality of cooling paths 15 separated from each other inside the substrate 1.

FIGS. 19 to 23 are diagrams for describing a method of manufacturing a power device 120 according to another example embodiment. The structure and manufacturing process of the power device 120 according to another example embodiment are the same as or similar to the structure and manufacturing process of the power device 50 according to the embodiments described with reference to FIGS. 8 to 13, except that the material region 17 blocking the inlet 10a of the cooling space region 10 is provided, and thus redundant description thereof will be omitted. The substrate 1 in which the cooling space region 10 is formed to a predetermined depth shown in FIG. 19 may be formed by applying the above-described manufacturing processes with reference to FIGS. 8 to 10 and 29A to 29C. In this case, the cooling path 15 as described with reference to FIGS. 1 and 2 may be formed inside the substrate 1.

Figure 19:
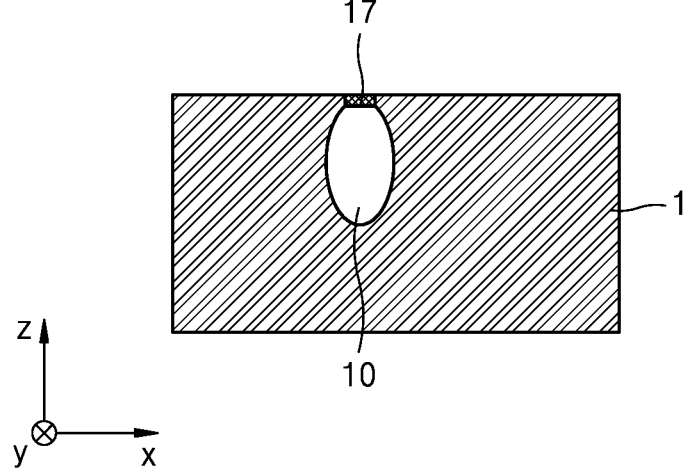
FIGS. 19 to 23 are diagrams for describing a method of manufacturing a power device according to another example embodiment.

Referring to FIG. 19, for the substrate 1 where the cooling space region 10 is formed to a certain depth, a material region 17 may be formed to block the inlet 10a of the cooling space region 10. The material region 17 may be formed to block the inlet 10a of the cooling space region 10 with any one of Si, SiN, and SiO, for example. When the material region 17 blocking the inlet 10a of the cooling space region 10 is separately formed, the inlet 10a of the space region 10 may have a critical size capable of epitaxial growth or may be larger than the critical size.

Figure 20A:
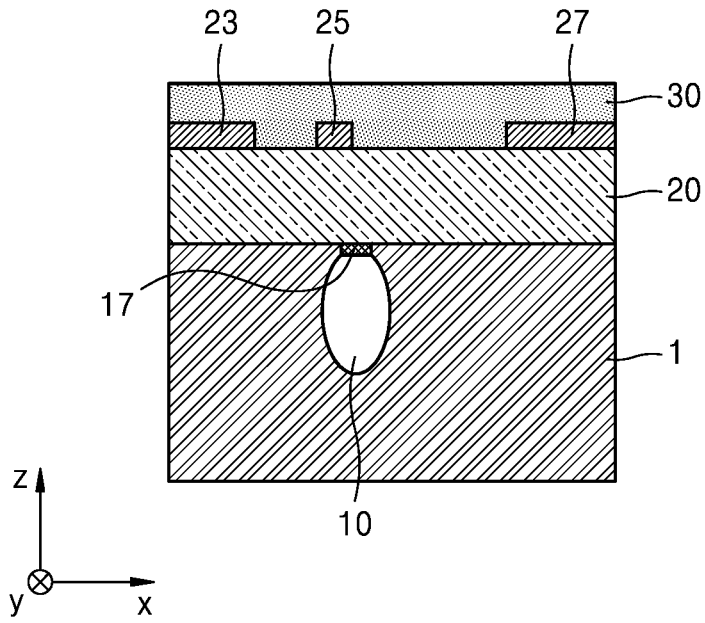
Figure 20B:
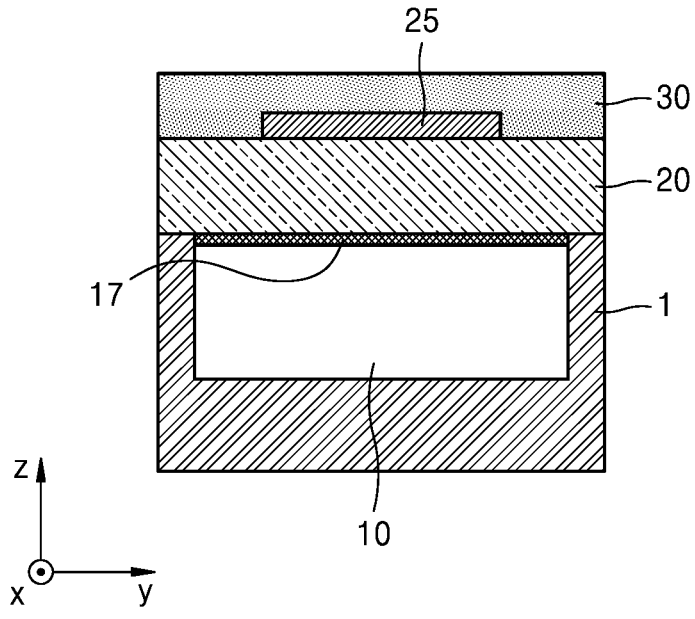

Next, as shown in FIGS. 20A and 20B, the compound semiconductor layer 20 may be epitaxially grown on the substrate 1, a gate 25, a source 23, and a drain 27 may be formed on the compound semiconductor layer 20, and a passivation layer 30 may be formed to cover the gate 25, the source 23, and the drain 27.

Figure 21:
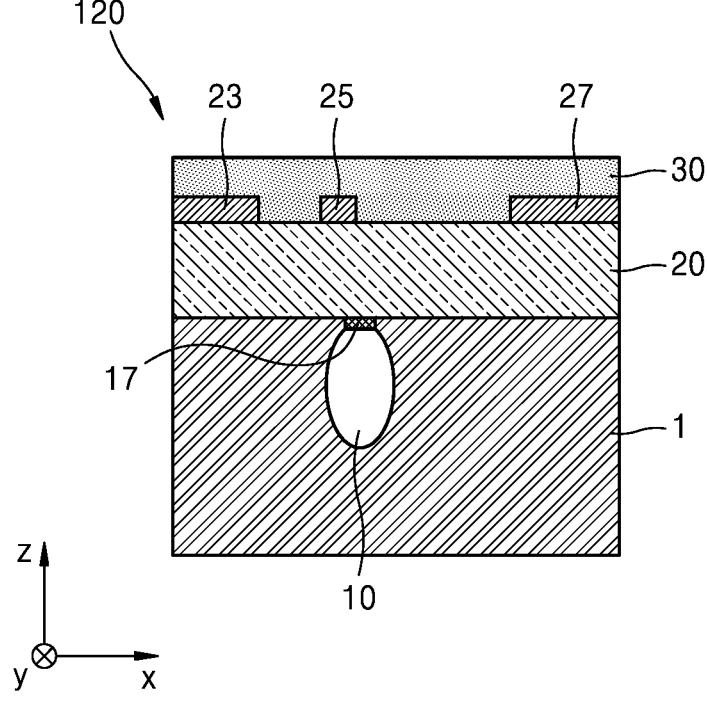
Figure 22:
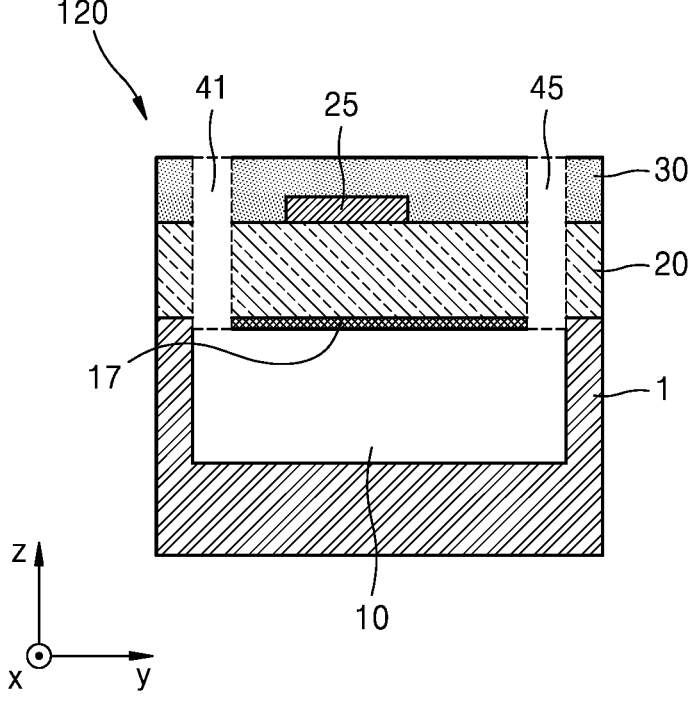

Then, a plurality of trenches, e.g., first and second trenches 41 and 45 may be formed across the passivation layer 30 and the compound semiconductor layer 20 as shown in FIGS. 21 and 22, whereby the cooling space region may be opened. Alternatively, the passivation layer 30 and lower layers thereof may be diced at positions spaced apart from both ends of the gate 25 as shown in FIG. 23, whereby the cooling space region 10 may be opened.

FIGS. 21 and 22 are cross-sectional views schematically illustrating a power device 120 according to an example embodiment. An example of forming a plurality of trenches, for example, first and second trenches 41 and 45 across the passivation layer 30 and the compound semiconductor layer 20 is shown. Except that the power device 120 according to the embodiments of FIGS. 21 and 22 further includes a material region 17 to block the inlet 10a of the cooling space region 10, the remaining configuration of the power device 120 according to the embodiments may be the same as that of the power device 50 according to the embodiments described with reference to FIGS. 3 and 4. FIG. 21 corresponds to a cross-sectional view taken along line I-I' of FIGS. 1 and 2, and FIG. 22 corresponds to a cross-sectional view taken along line II-II' of FIGS. 1 and 2.

Figure 23:
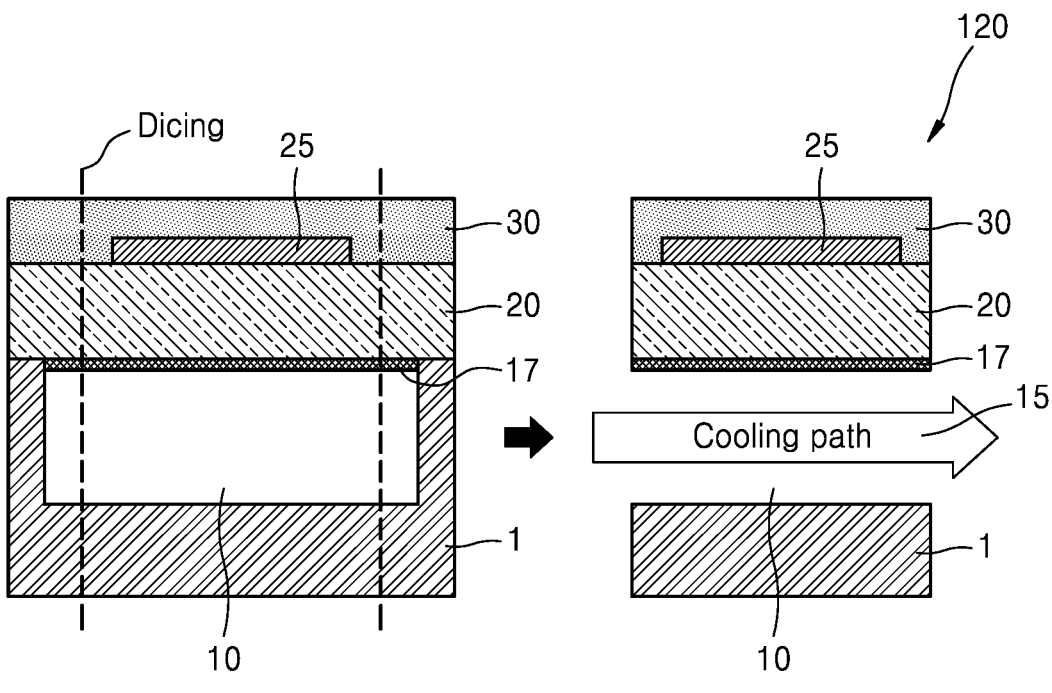

FIG. 23 is a view showing an example in which the power device 120 according to another example embodiment is formed to open the cooling space region 10 by dicing, and as in FIG. 13, the left-hand view shows the state before opening the cooling space region 10 by dicing, and the right-hand view shows the state after opening the cooling space region 10 by dicing.

Referring to FIG. 23, in order to manufacture the power device 120 according to another example embodiment, the cooling space region 10 may be opened by dicing the passivation layer 30 and the lower layers thereof at positions spaced apart from both ends of the gate 25.

In this case, in the power device 120 according to another example embodiment, the cooling space region 10 may be formed to have multiple cooling paths 15 separated from each other inside the substrate 1, and a part in which the dicing is performed may correspond to a dashed box position in FIG. 2, for example. As another example, even when the cooling space region 10 is formed to have one cooling path 15 inside the substrate 1, as illustrated in FIG. 1, the passivation layer 30 and lower layers thereof may be diced at positions spaced apart from both ends of the gate 25 to open the cooling space region 10. In this case, only one end and the last end of the cooling path 15 may be diced to be opened, and the one end and the last end of the cooling path 15 may be formed to protrude from the second part 15*b* to enable such an open structure. In addition, the passivation layer 30 and lower layers thereof may be diced to remove the second part 15*b* of the cooling path 15 in FIG. 1. In this case, the power device 120 may have a plurality of cooling paths 15 separated from each other inside the substrate 1.

FIGS. 24 to 27 are diagrams for describing a method of manufacturing a power device 130 according to another example embodiment. The power device 130 according to another example embodiment is the same as or similar to the power device 50' according to the embodiment described with reference to FIGS. 8 to 11B and 13, except that, in a state in which the cooling space region 10 formed inside the substrate 1 is filled with a filling material 13, epitaxial growth and subsequent processes of the compound semiconductor layer 20 are performed, and the cooling space region 10 is opened by a dicing process, and thus redundant descriptions will be omitted herein. The substrate 1 in which the cooling space region 10 is formed to a predetermined depth shown in FIG. 24 may be formed by applying the above-described manufacturing processes with reference to FIGS. 8 to 10 and 29A to 29C. In this case, the cooling path 15 as described with reference to FIGS. 1 and 2 may be formed inside the substrate 1.

Figure 24:
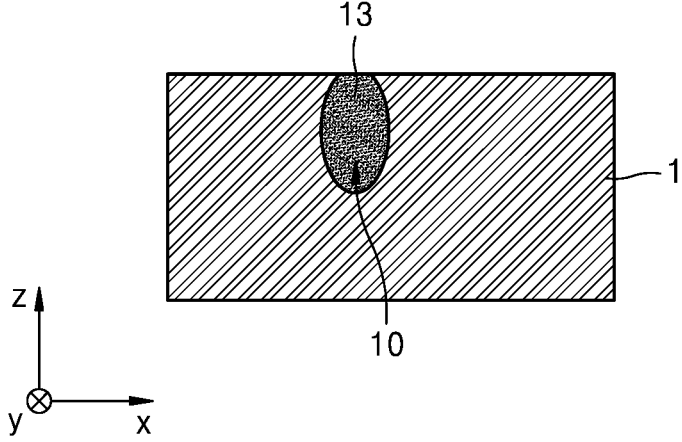
FIGS. 24 to 27 are diagrams for describing a method of manufacturing a power device according to another example embodiment.

Referring to FIG. 24, for the substrate 1 where the cooling space region 10 is formed to a certain depth, the empty space inside the substrate 1, that is, the cooling space region 10 may be filled with the filling material 13. The filling material 13 may be, for example, a material capable of wet etching. The filling material 13 may include, for example, at least one of SiO₂ and SiN.

Figure 25A:
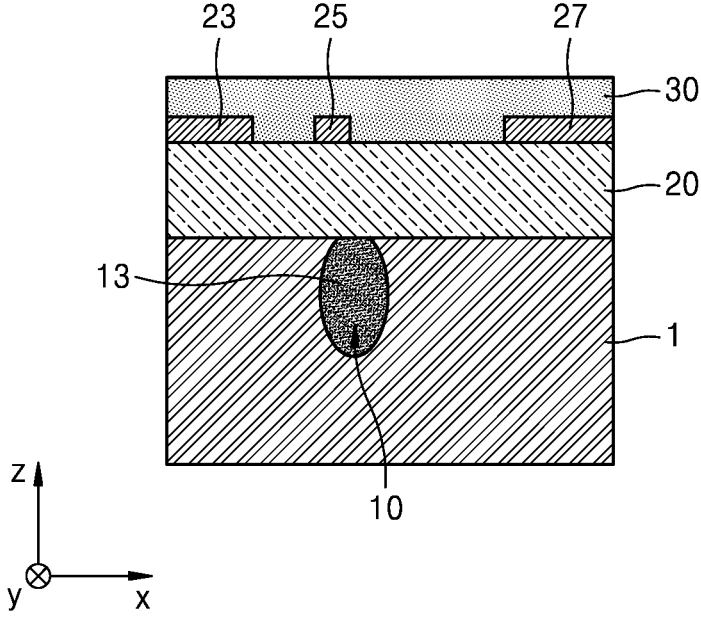
Figure 25B:
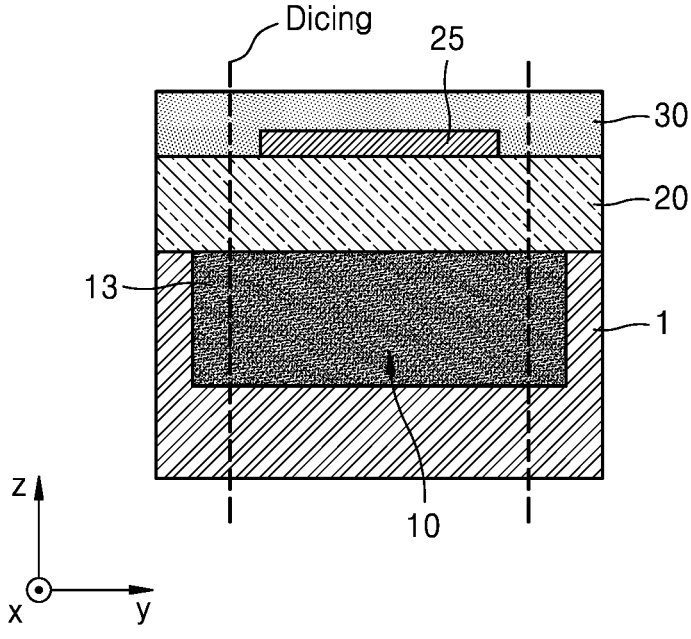

Next, as shown in FIGS. 25A and 25B, the compound semiconductor layer 20 may be epitaxially grown on the substrate 1, a gate 25, a source 23, and a drain 27 may be formed on the compound semiconductor layer 20, and a passivation layer 30 may be formed to cover the gate 25, the source 23, and the drain 27. FIG. 25A corresponds to a cross-sectional view taken along line I-I' of FIGS. 1 and 2, and FIG. 25B corresponds to a cross-sectional view taken along line II-II' of FIGS. 1 and 2.

Figure 26:
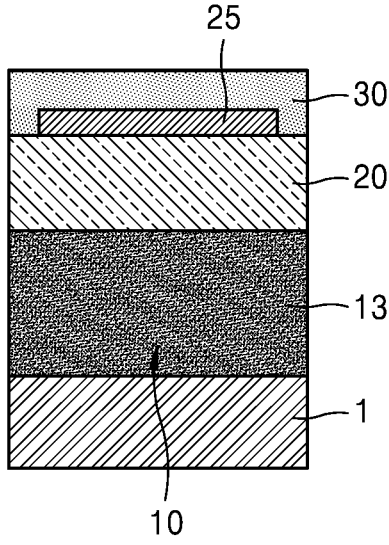
Figure 27:
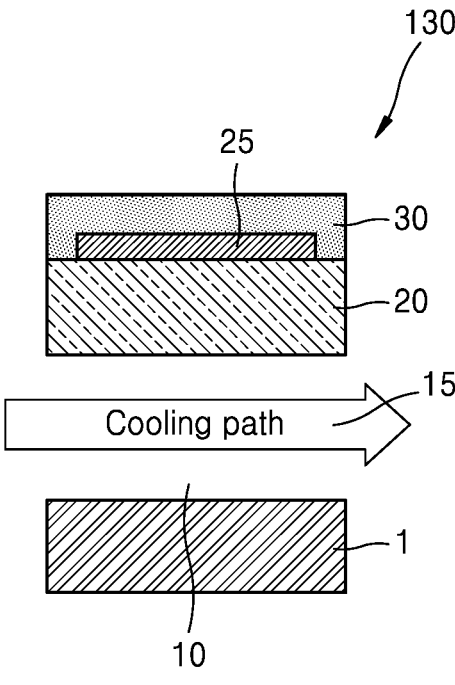

Then, as shown in FIG. 26, the cooling space region 10 may be opened by dicing the passivation layer 30 and the lower layers thereof at positions spaced apart from both ends of the gate 25. Then, when the filling material 13 filling the cooling space region 10 opened is removed by a wet etching process, the cooling space region 10 is opened as shown in FIG. 27 to obtain the power device 130 with the cooling path 15 formed therein. FIG. 27 shows a power device 130 in which a cooling path 15 is formed by an opened cooling space region inside the substrate 1 by opening the cooling space region 10 by dicing and removing the filling material 13 by a wet etching process.

In this case, in the power device 130, the cooling space region 10 may form multiple cooling paths 15 separated from each other inside the substrate 1, and a part in which the dicing is performed may correspond to a dashed box position in FIG. 2, for example. As another example, even when the cooling space region 10 is formed to have one cooling path 15 inside the substrate 1, as illustrated in FIG. 1, the passivation layer 30 and lower layers thereof may be diced to remove the second part 15*b* of the cooling path 15 at positions spaced apart from both ends of the gate 25 to open the cooling space region 10. Even in this case, the power device 130 may have a plurality of cooling paths 15 separated from each other inside the substrate 1.

In the power devices 50, 50', 100, 120, and 130 according to various example embodiments described above, the cooling space region 10 may be maintained in an empty state or may be filled with a material having good thermal conductivity.

Figure 28:
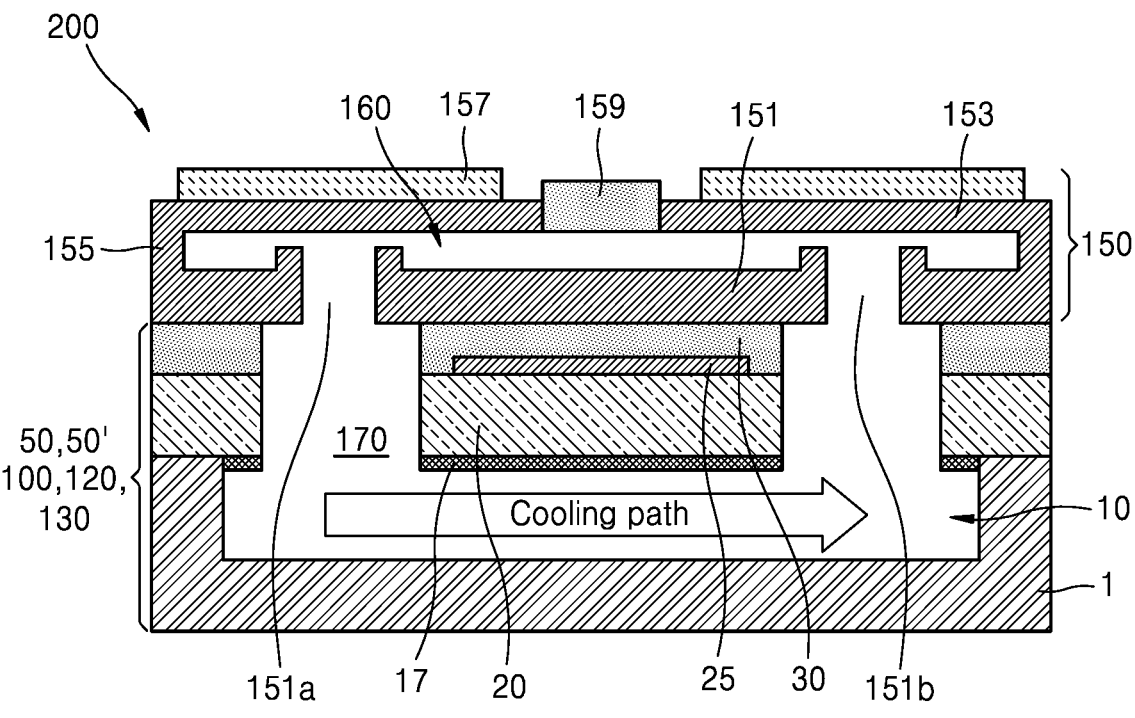
FIG. 28 is a cross-sectional view schematically illustrating a power device according to another example embodiment.

FIG. 28 is a cross-sectional view schematically illustrating a power device 200 according to another example embodiment. Compared to the power devices 50, 50', 100, 120, and 130 of the above various example embodiments, the power device 200 according to another example embodiment further includes a pump structure 150 having an inner space 160 openly connected to a cooling space region 10 through a trench on the passivation layer 30. FIG. 28 shows an example where the power device 200 according to another example embodiment further includes the pump structure 150 in the structure of FIG. 22, but the embodiment is not limited thereto. The power device 200 may have a structure in which the pump structure 150 is further provided in any of the structures of the power devices 50, 50', 100, 120, and 130 of the various example embodiments described above.

Referring to FIG. 28, in the power device 200 according to another example embodiment, the pump structure 150 may be formed on the passivation layer 30 and may include a first plate 151, a second plate 153 spaced apart from the first plate 151, and a sidewall 155 connecting the first plate 151 and the second plate 153 to form the inner space 160 connected to the cooling space region 10 to be opened. A plurality of openings may be formed in the first plate 151 to correspond to a plurality of trenches so as to be openly connected to the cooling space region 10. For example, first and second openings 151*a* and 151*b* may be formed on the first plate 151 to correspond to the first and second trenches 41 and 45. A piezoelectric member 157 may be further provided on the second plate 153. The power device 200 may further include a cooling fluid 170 filling the cooling space region 10 and the inner space 160 of the pump structure 150. The cooling fluid 170 may include a liquid or a refrigerant having good thermal conductivity.

As shown in FIG. 28, when the power device 200 further includes the pump structure 150, a cooling fluid 170 may flow according to the driving of the pump structure 150 to form a cooling path in the cooling space region 10 and the inner space 160 of the pump structure 150.

In order to manufacture the power device 200 according to another example embodiment, a plurality of trenches, for example, first and second trenches 41 and 45 may be formed to open the cooling space region 10 over the passivation layer 30 and the compound semiconductor layer 20, and a pump structure 150 may be formed on the passivation layer 30 to form an internal space 160 openly connected to the cooling space region 10 through the first and second trenches 41 and 45. Then, the cooling space region 10 and the inner space 160 of the pump structure 150 may be filled with the cooling fluid 170, and the pump structure 150 may be sealed. A sealed region 159 may be sealed. As another example, the sealed region 159 may be provided to be opened and closed so that the cooling fluid 170 may be replaced or replenished as necessary.

In this way, when the pump structure 150 having the piezoelectric member 157, that is, the piezoelectric pump structure is integrally configured and embedded in the power device 200, a power device enabling a small and a more smooth control of the cooling effect may be implemented.

Meanwhile, according to the power devices 50, 50', 100, 120, 130, and 200 according to various example embodiments, when the cooling space region 10 is opened by forming trenches 41 and 45, the cooling path 15 may be opened to the front of the chip without being opened at the side of the chip. In this case, the cooling path 15 may be secured at the wafer level even before reaching the package level. In addition, an additional process using the cooling path 15 is possible. As another example, when the cooling space region 10 is opened by dicing, the cooling path 15 may be formed in units of chips.

In the power device and the manufacturing method thereof according to the embodiments, the cooling space region having the enlargement region whose width increases with depth from the surface of the substrate is formed to have the cooling path inside the substrate, and thus it is possible to implement a cooling system integrated power device with high chip integration and increased cooling effect.

According to the power device and the manufacturing method thereof according to the embodiments, the cooling path may be formed only by a frontside process, which is benefits in terms of process unit cost.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A power device comprising:
a substrate;
a compound semiconductor layer epitaxially grown on the substrate;
a gate formed on the compound semiconductor layer;
a source provided on a first side of the gate and a drain provided on a second side of the gate;
a passivation layer provided on the source, drain, and gate; and
a cooling space region configured to form a cooling path inside the substrate,
wherein the cooling space region comprises an enlargement region having a width, which increases according to a depth from a surface of the substrate, wherein the width of an inlet of the cooling space region is less than a maximum width of the enlargement region, and
wherein the passivation layer and the compound semiconductor layer are configured to form an opening for the cooling space region.

2. The power device of claim 1, further comprising one or more trenches formed on the passivation layer and the compound semiconductor layer, and connected to the cooling space region.

3. The power device of claim 2, wherein the cooling space region is connected to outside through the one or more trenches to form a cooling path.

4. The power device of claim 2, further comprising: a pump structure provided to form an inner space openly connected to the cooling space region on the passivation layer; and
a cooling fluid filling an inner space of the pump structure and the cooling space region,
wherein the cooling fluid flows according to driving of the pump structure to form a cooling path in the cooling space region and the inner space of the pump structure.

5. The power device of claim 4, wherein the pump structure comprises:
a first plate with a plurality of openings corresponding to the plurality of trenches to be openly connected to the cooling space region;
a second plate spaced apart from the first plate to form an inner space of the pump structure;
a sidewall connecting the first plate with the second plate; and
a piezoelectric member provided on the second plate.

6. The power device of claim 1, wherein the passivation layer and the layer below the passivation layer are diced at a position spaced apart from both ends of the gate to open the cooling space region.

7. The power device of claim 1, wherein the width of the inlet of the cooling space region has a critical size for allowing epitaxial growth on the substrate.

8. The power device of claim 1, further comprises a blocking layer formed in the inlet of the cooling space region, the blocking layer comprising a material of the substrate.

9. The power device of claim 8, wherein the substrate is a Si-based substrate, and the blocking layer comprises the material comprising one of Si, SiN, or SiO.

10. The power device of claim 1, wherein the compound semiconductor layer comprises a GaN-based material, and forms a channel.

11. A method of manufacturing a power device, the method comprising:
preparing a substrate;
forming a cooling path inside the substrate by forming a cooling space region including an enlargement region having a width, which increases according to a depth from a surface of the substrate and a width of an inlet of the cooling space region is less than a maximum width of the enlargement region;
epitaxially growing a compound semiconductor layer on the substrate on which the cooling space region is formed;
forming a gate on the compound semiconductor layer;
forming a source on a first side of the gate;
forming a drain on a second side of the gate;
forming a passivation layer on the source, the drain, and the gate, and opening the cooling space region through the passivation layer and the compound semiconductor layer.

12. The method of claim 11, wherein the forming of the cooling space region comprises:

forming a mask pattern having an opening at a position corresponding to an inlet of the cooling space region on the substrate;

forming a trench by performing a first etching process on the substrate;

forming a second passivation layer in a region including an opening of the mask pattern and an inlet of the cooling space region; and performing a second etching process on the substrate to increase the depth and width of the trench, wherein the forming of the second passivation layer and the performing of the second etching process are performed at least once to form the cooling space region.

13. The method of claim 11, further comprising forming a plurality of trenches in the passivation layer and the compound semiconductor layer to form an opening for the cooling space region.

14. The method of claim 13, further comprising forming a pump structure on the passivation layer to form an inner space openly connected to the cooling space region through the plurality of trenches; and filling the cooling space region and an inner space of the pump structure with a cooling fluid, and sealing the pump structure.

15. The method of claim 14, wherein the pump structure includes: a first plate with a plurality of openings corresponding to the plurality of trenches to be openly connected to the cooling space region; a second plate spaced apart from the first plate to form an inner space of the pump structure; a sidewall connecting the first plate with the second plate; and a piezoelectric member on the second plate.

16. The method of claim 11, further comprising dicing the passivation layer and the layer below the passivation layer at a position spaced apart from both ends of the gate to open the cooling space region.

17. The method of claim 11, wherein the width of the inlet of the cooling space region has a critical size for allowing epitaxial growth on the substrate.

18. The method of claim 11, further comprising forming a blocking layer in the inlet of the cooling space region, the blocking layer including a material of the substrate.

19. The method of claim 18, wherein the substrate is a Si-based substrate, and the blocking layer includes the material including one of Si, SiN, or SiO.

20. The method of claim 11, wherein the compound semiconductor layer includes a GaN-based material, and forms a channel.

\* \* \* \* \*